(12) United States Patent
Nishizaka et al.

(10) Patent No.: US 6,979,856 B2
(45) Date of Patent: Dec. 27, 2005

(54) SEMICONDUCTOR MEMORY DEVICE AND CONTROL METHOD AND MANUFACTURING METHOD THEREOF

(75) Inventors: Teiichiro Nishizaka, Kanagawa (JP); Isami Sakai, Kanagawa (JP); Akira Yoshino, Kanagawa (JP); Shinichi Kawai, Kanagawa (JP); Kiyokazu Ishige, Kanagawa (JP); Tomohiro Hamajima, Kanagawa (JP); Motoko Tanaka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/648,295

(22) Filed: Aug. 27, 2003

(65) Prior Publication Data
US 2004/0071011 A1 Apr. 15, 2004

(30) Foreign Application Priority Data
Aug. 30, 2002 (JP) ........................ 2002-255561

(51) Int. Cl.⁷ ............................... H01L 29/76
(52) U.S. Cl. .................. 257/314; 257/315; 257/319
(58) Field of Search ................... 257/314–319

(56) References Cited
U.S. PATENT DOCUMENTS
5,751,631 A * 5/1998 Liu et al. ............... 365/185.01
5,760,437 A * 6/1998 Shimoji ..................... 257/316
6,256,231 B1  7/2001 Lavi et al.

FOREIGN PATENT DOCUMENTS
JP       5-174583       7/1993
JP       5-343645      12/1993

* cited by examiner

Primary Examiner—Douglas W. Owens
(74) Attorney, Agent, or Firm—McGinn & Gibb, PLLC

(57) ABSTRACT

A semiconductor memory device includes a first insulating film provided on a semiconductor substrate between first and second diffusion regions, a first gate electrode provided on the first insulating film, a second insulating film provided on the semiconductor substrate between the second diffusion region and a third diffusion region, and a second gate electrode provided on the second insulating film. The first and second diffusion regions, first insulating film, and first gate electrode constitute a first memory cell, while the second and third diffusion regions, second insulating film, and second gate electrode constitute a second memory cell. The first and second gate electrodes are connected in common to form a word line electrode. The first and third diffusion regions are connected to first and second read bit lines. The second diffusion region is connected to a program and erase bit line.

26 Claims, 20 Drawing Sheets

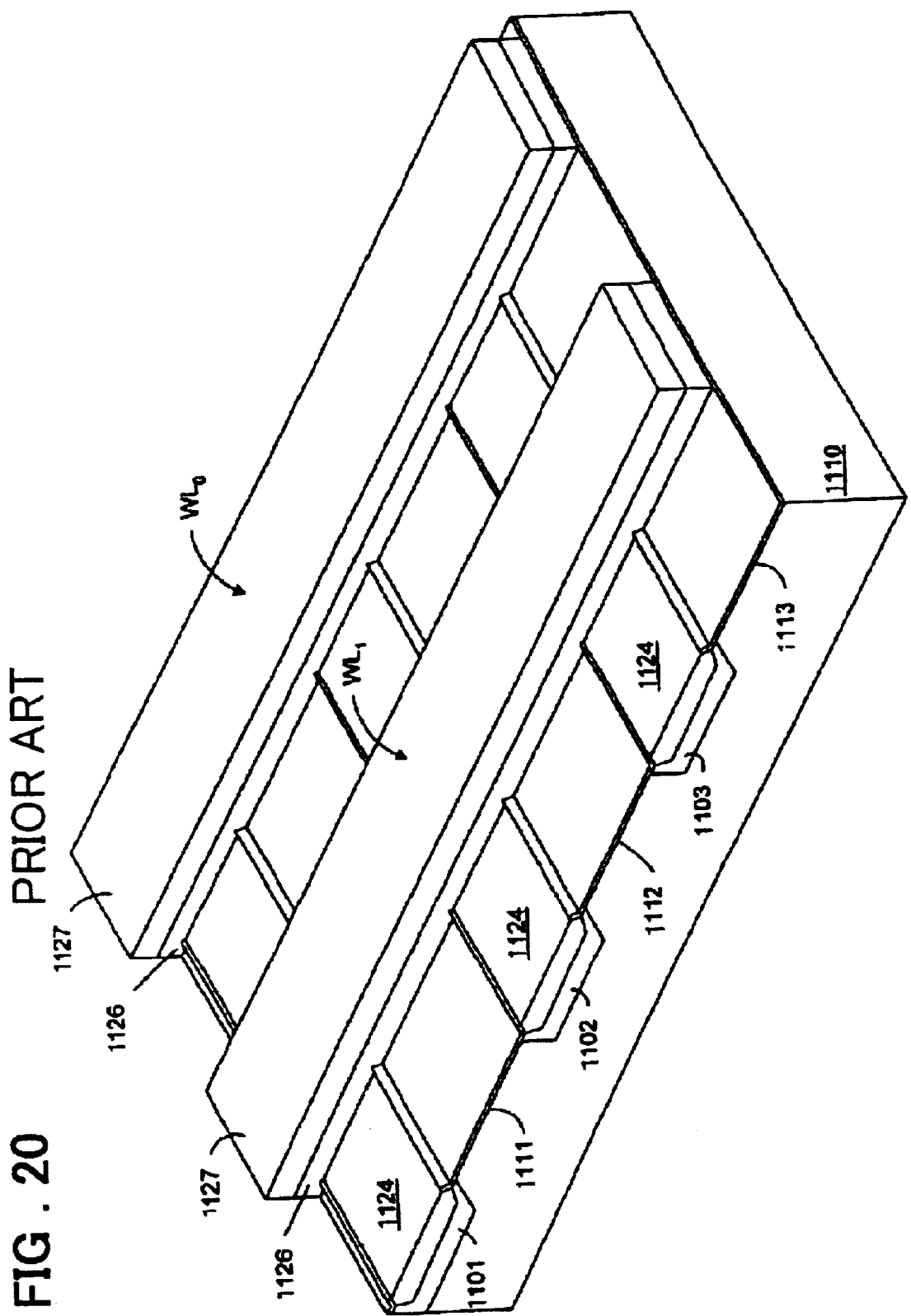

SEMICONDUCTOR MEMORY DEVICE AND CONTROL METHOD AND MANUFACTURING METHOD THEREOF

FIELD OF THE INVENTION

The present invention relates to a non-volatile semiconductor memory device. More specifically, the invention relates to a MONOS-type flash memory.

BACKGROUND OF THE INVENTION

As a non-volatile semiconductor memory, such as an electrically erasable and programmable read only memory (EEPROM) device, there is disclosed in Japanese Patent Kokai Publication JP-A-5-174583, an X-cell configuration of a split-gate type non-volatile semiconductor memory device that enabled a high integration being substantially the same as with stack-gate type memory cells. In this split-gate type non-volatile semiconductor memory device, each memory cell has an address gate electrode and a memory gate electrode. Referring to FIGS. 16 and 17, the non-volatile semiconductor memory device described in the above-mentioned Japanese Patent Kokai Publication JP-A-5-174583 will be described. Since the device has a layout configuration in which four memory cells 310, 320, 330, and 340 share one contact region 360 and are disposed in an X pattern with the region 360 being a center, the configuration is referred to an X-structure layout or an X-cell. Incidentally, the X-cell will also be referenced from Japanese Patent Kokai Publication JP-A-5-343645, for example.

Referring to a partial circuit diagram shown in FIG. 16, there are arranged four memory cells 310, 320, 330, and 340. The memory cells 310 and 340 constitute part of memory cells of a row connecting an upper left and a lower right of the drawing, while the memory cells 320 and 330 constitute part of memory cells of a row connecting an upper right and a lower left of the drawing. In addition, three are provided bit lines $B_{i-1}$, $B_i$, and $B_{i+1}$, extending in parallel from top to bottom.

The bit line $B_i$ is connected to one of source/drain electrodes 311 and 312, 321 and 322, 331 and 332, and 341 and 342, or the electrodes 312, 322, 331, and 341, via a bit contact 360.

The bit line $B_{i-1}$ is connected to the other one of the source/drain electrodes 311 and 332 of the memory cells 310 and 330 via bit contacts 361 and 362, respectively.

The bit line $B_{i+1}$ is connected to the other one of the source/drain electrodes 321 and 342 of the memory cells 320 and 340 via bit contacts 363 and 364, respectively.

Each memory cell is comprised of two transistors: address selection transistors and memory transistors (devices encircled in FIG. 16).

A memory transistor of the memory cell 310 having a memory gate electrode 314 is connected to the bit line $B_{i-1}$ via the bit contact 361.

The memory transistors of the memory cells 320 and 330 having memory gate electrodes 324 and 334 respectively are connected to the bit line $B_i$ via the bit contact 360.

The memory transistor of the memory cell 340 having a memory gate electrode 344 is connected to the bit line $B_{i+1}$ via the bit contact 364.

The memory gate electrode 314 of the memory transistor in the memory cell 310 and the memory cell electrode 324 of the memory transistor in the memory cell 320 are composed by a word line W1, while address gate electrodes 313 and 323 of their address selection transistors are composed by an address gate line X1.

The memory gate electrode 334 of the memory transistor in the memory cell 330 and the memory gate electrode 344 of the memory transistor in the memory cell 340 are composed by a word line W2, while the address gate electrodes 333 and 343 of their address selection transistors are composed by an address gate line X2.

FIG. 17 is a layout diagram of a circuit shown in FIG. 16 on a semiconductor chip. The address gate line X1 and the word line W1 cross to each other. Likewise, the address gate line X2 and the word line W2 also cross to each other.

The above mentioned layout is adopted for the sake of the operations of programming and erasing memory the transistors.

An operation of programming the memory cell 320 will be described by way of an example. 9V is applied to the word line W1 of the memory cell 320. 0V voltage is applied to the bit line $B_i$, while 9V is applied to the bit line $B_{i-1}$. At this point, 0V is applied to the address gate line X1. Programming (which is termed as "Fowler-Nordheim tunneling", or also termed as "F-N tunneling") the memory cell 320 is thereby performed.

At this point, 0V are applied to both of the address gate line X2 and the word line W2 for the memory cells 330 and 340, so that the F-N tunneling does not occur. Thus, no programming is performed.

Furthermore, since the word line W1, address gate line X1, and bit line $B_i$ for the memory cell 310 are the same as in the memory cell 320 and a program inhibiting voltage of 9V is applied to the bit line $B_{i-1}$. Thus, programming the memory cell 310 is not performed.

The reason why the address gate line X1 and the word line W1 cross to each other is to prevent occurrence of erroneous programming the memory cell 310 when the writing operation to the memory cell 320 is performed. That is, when the programming the memory cell 320 is performed, arrangement is made so that the program inhibiting voltage of 9V can be applied to the memory transistor of the memory cell 310 from the bit line $B_{i-1}$.

The reason why one memory cell is constituted from two transistors, or has a split-gate configuration including the address gate electrode and the memory gate electrode is that if programming caused by the F-N tunneling is employed for an X cell, an adjacent cell is also programmed simultaneously. This problem will be described with reference to FIG. 18 that schematically shows two adjacent memory cells. Referring to FIG. 18, reference numeral 1 denotes a P-type semiconductor substrate, reference numerals 2A, 2B, and 2C denote N+ diffusion regions, reference numerals 3A and 3B are ONO films each constituted from a silicon oxide film, a silicon nitride film, and the silicon oxide film, and reference numerals 4A and 4B denote gate electrodes. A first memory cell is composed by the diffusion regions 2A and 2C, ONO film (of the silicon oxide film, silicon nitride film, and silicon oxide film) 3A, and gate electrode 4A. A second memory cell is composed by the diffusion regions 2B and 2C, ONO film 3B, and gate electrode 4B. The word line for the first and second memory cells is commonly connected. By applying a high voltage to the gate electrodes 4A and 4B through the word line and a ground potential (0V) is applied to a contact for the diffusion region 2C, the second memory cell adjacent to the first memory cell is also programmed simultaneously. For this reason, as shown in FIGS. 16 and 17, the memory cell is composed by two transistors including the address selection transistor and the memory transistor.

In a configuration described with reference to FIGS. 16 and 17, since one memory cell is constituted from two elements of the address selection transistor and the memory transistor, memory cell size increases.

Further, in the configuration described with reference to FIGS. 16 and 17, a structure where the address gate line and the word line cross to each other is essential for applying a program inhibit voltage to a memory cell not to be programmed so as to prevent occurrence of multiple simultaneous programming of the memory cell not to be programmed. This structure is difficult to be manufactured in view of process technology.

In addition, in the configuration described with reference to FIGS. 16 and 17, there are overlaps between the address gate line and the word line. Thus, application of a silicidation/salicidation process, which is commonly employed in a manufacturing process of a logic device is difficult.

A configuration disclosed in U.S. Pat. No. 6,256,231 B1 as other related art will be described. As shown in FIG. 19, in one memory cell transistor, there is provided nodes 26 and 28 for storing two bits information to achieve high integration of memory cells. Referring to FIG. 19, reference numeral 12 denotes the P-type silicon substrate, reference numeral 14 denotes a source diffusion region, reference numeral 16 denotes a drain diffusion region, reference numerals 18, 20, and 22 denote the silicon oxide film, silicon nitride film, and the silicon oxide film, respectively, which constitute the ONO film, and reference numeral 24 denotes the gate electrode. In a memory cell array configuration, as shown in FIG. 20, buried N-type diffusion regions 1101, 1102, and 1103 are formed in a P-type silicon substrate 1110 to be employed as bit lines. Further, silicon oxide films 1124 are formed over the N-type diffusion regions 1101, 1102, and 1103. Between the mutually adjacent N-type diffusion regions such as between the N-type diffusion regions 1101 and 1102, N-type diffusion regions 1102 and 1103, N-type diffusion region 1103 and an adjacent diffusion region not shown, ONO films 1111, 1112, and 1113 are formed respectively to function to trap electrons injected into a memory cell.

Over the silicon oxide films 1124 and the ONO films 1111 to 1113, word lines made of impurity-doped polycrystalline silicon (termed as "polysilicon") 1126 and metal silicide 1127 are formed.

However, the configuration shown in FIG. 20, is such a structure to which the application of a salicide process employing commonly used a refractory metal (which has a high melting point) such as W, Mo, Ta, Ti, or the like or a semi-precious metal such as Co is extremely difficult.

More specifically, the silicon oxide films 1124 formed over the N-type diffusion regions and the ONO films 1111 to 1113 formed on the silicon substrate have a film thickness which is comparatively thin. On the other hand, as will be described later, before formation of a metal silicide layer using a refractory metal, a sidewall spacer is formed. The side wall spacer is formed because of a need for providing electrical insulation so that a short circuit between the gate electrode and the N-type diffusion region may not occur due to the metal silicide layer.

For the formation of the sidewall spacer, generally, the silicon oxide film is deposited over the substrate by CVD (Chemical Vapor Deposition) or the like, and then an etch back process using dry etching such as RIE (Reactive Ion Etching) is performed. During a step of this etch back process, the comparatively thin ONO films 1111 to 1113 and the silicon oxide films 1124 are removed by etching and hence the N-type diffusion regions and the silicon substrate 1110 are exposed.

In this state, an electrical short circuit occurs between the N-type diffusion region and the silicon substrate due to the refractory metal, deposited on an entire surface of the substrate. An operational failure is thereby caused. In the memory cell array configuration shown in FIG. 20, the silicidation is extremely difficult.

As a single-transistor EEPROM with an ONO gate insulating film, using single polysilicon, where programming is performed by hot electron injection, the description in such a reference as "A True Single-Transistor Oxide-Nitride-Oxide EEPROM device", IEEE EDL-8, No. 3, 1987, P.93 by T. Y. CHAN et al. can also be referred.

SUMMARY OF THE DISCLOSURE

Accordingly, it is an object of the present invention to provide a semiconductor memory device and a manufacturing method thereof which can reduce memory cell size, can facilitate salicidation, and can reduce a voltage necessary for a program operation to a low level.

The above and other objects are attained by a semiconductor memory device in accordance of one aspect of the present invention, which comprises a cell array having a plurality of unit cells, in which each four unit cells shares one contact region and is arranged in an X pattern with said contact region being a center thereof. Each of the unit cells comprises one memory transistor including first and second diffusion regions provided in the surface of a substrate and separated each other, an insulating film comprising an electric charge trapping film, formed on the substrate to cover a region between the first and second diffusion regions, and a gate electrode provided on the insulating film to form an electrode for a word line, wherein at least one of the first diffusion region and the second diffusion region for the each unit cell is shared by a unit cell adjacent to the unit cell, the first diffusion region is connected to a first read bit line disposed on a layer overlying the substrate, and the second diffusion region is connected to a second program and erase bit line disposed on the layer overlying the substrate.

When programming is performed, a predetermined positive voltage is applied to the word line connected to the unit cell to be programmed, a positive program voltage is applied to the second bit line connected to the unit cell, and the first bit line connected to the unit cell is set to a ground potential, thereby performing channel hot electron injection into the insulating film. Programming the unit cell to be programmed is thereby performed.

The erasing is performed by setting the word line connected to the unit cell to be erased to the ground potential, and applying a positive voltage to the second bit line connected to the unit cell, thereby causing a hot hole to be injected into the insulating film to neutralize electric charge.

In this manner, in the present invention, programming the unit cell is performed by hot electron injection into the first insulating film, while erasing is performed by hot hole injection into the first insulating film to neutralize electric charges. A memory cell of the X cell thus can be constituted from a single transistor.

A semiconductor memory device according to another aspect of the present invention comprises: a cell array having a plurality of memory cells; wherein for each mutually adjacent two memory cells in the cell array, there are accommodated first to third diffusion regions provided in a substrate to be spaced to one another; a first insulating film provided on the substrate to cover a region between the first diffusion region and the second diffusion region, and a first gate electrode provided on the first insulating film; and a second insulating film provided on the substrate to cover a region between the second diffusion region and the third diffusion region, and a second gate electrode provided on the second insulating film.

A memory cell transistor including the first and second diffusion regions, the first insulating film, and the first gate electrode constitutes a first memory cell, a memory cell transistor including the second and third diffusion regions, the second insulating film, and the second gate electrode constitutes a second memory cell. The first and second gate electrodes are connected to first and second word lines, respectively, or connected in common to form a word line electrode, the first diffusion region is connected to a first read bit line disposed on a layer overlying the substrate via a contact, the second diffusion region is connected to a second program and erase bit line disposed on the layer overlying the substrate via a contact; and the third diffusion region is connected to a third read bit line disposed on the layer overlying the substrate via a contact. In the present invention, the first and second insulating films include an electric charge trapping film.

In the present invention, when programming is performed, a predetermined positive voltage is applied to the word line connected to the gate electrode of a memory cell to be programmed, a positive program voltage is applied to the second program and erase bit line connected to the memory cell to be programmed, one of the first and third read bit lines connected to the memory cell to be programmed is set to the ground potential, and other bit line is set to a positive program inhibiting voltage. In the present invention, when programming is performed, preferably, the positive program voltage is applied from both sides of the second program and erase bit line, thereby increasing capability of supplying program currents. In other words, a program voltage supplied to the second bit line from one end can be reduced to a low level.

In the present invention, preferably, the gate electrodes include a metal silicide layer made by silicidation on their surfaces of polycrystalline silicon using a refractory metal or a semi-precious metal. Further, surfaces of the diffusion regions are also silicided by the refractory metal or the semi-precious metal.

In the present invention, an impurity region of an opposite polarity to the diffusion regions is included at the end of the second diffusion region immediately under at least one gate electrode of the first and second gate electrodes.

In the present invention, an impurity region of a same polarity as the diffusion regions and with a lower concentration than the diffusion regions is included at the end portion of at least one of the first diffusion region immediately under the first gate electrode and the third diffusion region immediately under the second gate electrode.

In the present invention, a first impurity region of the same polarity as the respective diffusion regions is included at the end portion of the second diffusion region immediately under at least one of the first gate electrode, and a second impurity region of the opposite polarity to the diffusion regions is included at the end portion of the first impurity region.

In the present invention, an impurity region of the opposite polarity to the diffusion regions is included in at least one of regions between the end portion of the second diffusion region immediately under the first gate electrode and the first diffusion region and between the end portion of the second diffusion region immediately under the second gate electrode and the third diffusion region.

A method of manufacturing a semiconductor memory device according to another aspect of the present invention comprises the steps of:

forming an insulating film and gate electrodes on a substrate and forming diffusion regions by doping an impurity into the surface of the substrate with the gate electrodes that have been patterned employed as masks, the diffusion regions comprising first to third diffusion regions, the first to third diffusion regions being formed in a first region located on one side of a first gate electrode, a second region located between the first gate electrode and a second gate electrode located on an opposite side to the one side of the first gate electrode, and a third region located on an opposite side to the second region for the second gate electrode, respectively;

forming an impurity region of an opposite polarity to the diffusion regions at the end of the second diffusion region immediately under at least one gate electrode of the first and second gate electrodes;

covering the substrate with an insulating film, and removing the insulating film by etch-back, thereby forming spacers made of the insulating film on side walls of the first and second gates; and depositing a metal film over the substrate for silicidation to form metal silicide layers on the surfaces of the gate electrodes and the surfaces of the diffusion regions.

A memory cell transistor including the first and second diffusion regions, the insulating film under the first gate electrode, and the first gate electrode comprises a first memory cell, and a memory cell transistor including the second and third diffusion regions, the insulating film under the second gate electrode, and the second gate electrode comprises a second memory cell.

The first and second gate electrodes are connected in common to form a word line.

The method further comprises the steps of:

covering the substrate with an insulating film and opening first to third contact openings at locations in the first to third diffusion regions;

filling a conductive material into the first to third contact openings; and connecting the first and third diffusion regions to first and third bit lines disposed on a layer overlying the substrate, respectively, and connecting the second diffusion region to a second bit line disposed on the layer overlying the substrate via a contact.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 20 is a diagram showing a configuration of the memory array of the conventional semiconductor memory device in FIG. 19.

PREFERRED EMBODIMENTS OF THE INVENTION

Figure 1A:
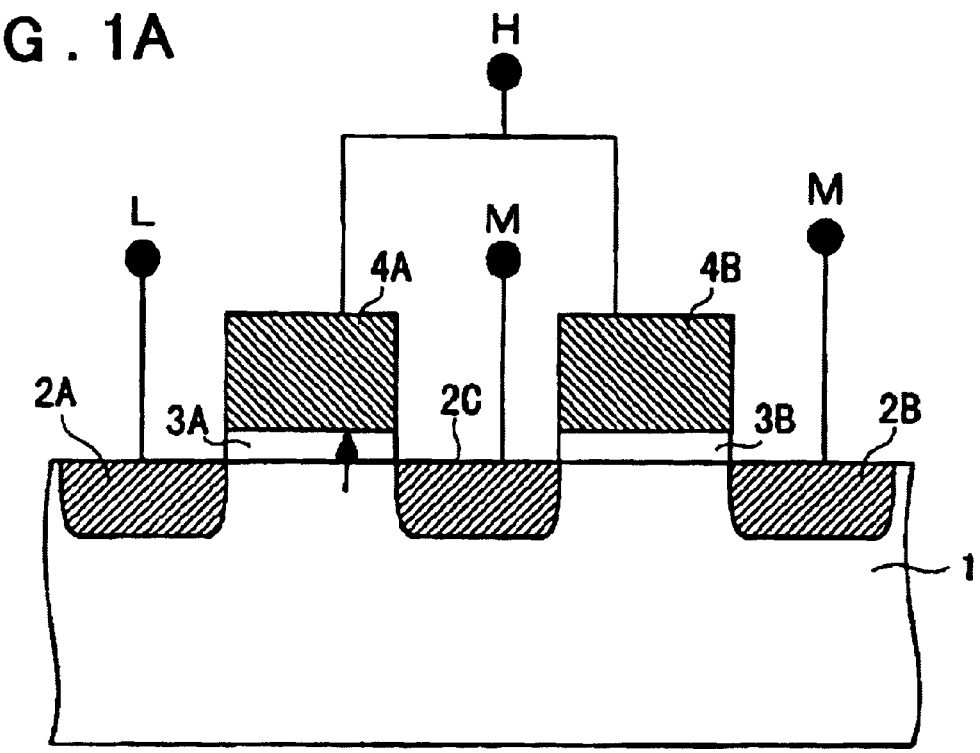
FIG. 1A is a diagram for explaining a principle underlying the present invention.

The preferred embodiment modes of the present invention will be described. In a semiconductor memory device according to an embodiment of the present invention, a cell array has a layout configuration in which each four memory cells shares one contact region and is arranged in an X pattern with the contact region being a center thereof. Referring to FIG. 1, two mutually adjacent memory cells connected to a common word line include first, second and third diffusion regions (2A, 2C, and 2B) provided in a substrate surface and separated to one another, a first insulating film (3A) provided on the substrate to cover a region between the first and second diffusion regions (2A and 2C), a first gate electrode (4A) provided on the first insulating film (3A), a second insulating film (3B) provided on the substrate between the second and third diffusion regions (2B and 2C), and a second gate electrode (4B) provided on the second insulating film (3B).

A memory cell including the first and second diffusion regions (2A and 2C), first insulating film (3A), and first gate electrode (4A) constitute a first memory cell, while a memory cell including the second and third diffusion regions (2C and 2B), second insulating film (3B), and second gate electrode (4B) constitute a second memory cell. The first and second gate electrodes (4A and 4B) are connected in common to form a word line, and the first diffusion region (2A) is connected to a first read bit line provided on a layer overlying the substrate via a contact. The second diffusion region (2C) is connected to a second program and erase bit line disposed on the layer overlying the substrate via a contact, and the third diffusion region (2B) is connected to a third read bit line provided on the layer overlying the substrate via a contact.

In the present invention, the first and second insulating films (3A and 3B) include an electric charge trapping film such as an ONO film. The respective gate electrodes (4A and 4B) of two adjacent memory cells such as MC1 and MC4 in FIG. 4 that will be described later are connected to different word lines.

Two memory cells of which the gate electrodes are connected to the common word line, shown in FIG. 1 correspond to the memory cell MC1 and a memory cell MC2 in FIG. 4, for example, which will be described later.

When programming is performed in the semiconductor memory device according to an embodiment of the present invention, a high voltage (H) is applied to the word line connected to a memory cell to be programmed. A positive program voltage (M)(lower than the H) is applied to the program and erase bit line (104 in FIG. 3) connected to the memory cell to be programmed, and one of the first and third read bit lines connected to the diffusion region of the memory cell to be programmed is set to a ground potential (L), and the other of the first and third read bit lines is set to a positive program inhibiting voltage (M). Then, channel hot electrons are injected into the insulating film of the memory cell to be programmed (4A/4B). At that moment, when programming is performed, the program voltage is applied from both sides of the second program and erase bit line (104 in FIG. 3) in a longitudinal direction, extended from one side to the other side of the cell array.

The ground potential or a negative voltage is applied to the word line connected to a memory cell to be erased. In the embodiment of the present invention, a positive erase voltage is applied to the second bit line connected to the memory cell to be erased to generate hot holes. Then, by injecting the hot holes into the insulating film of the memory cell and neutralizing electric charge of electrons trapped in the insulating film, erasing is performed.

In the embodiment of the present invention, the gate electrodes include a metal silicide layer made by silicidation on their surfaces of polycrystalline silicon using a refractory metal or a semi-precious metal. Further, surfaces of the diffusion regions (contact regions) are also silicided by the refractory metal or the semi-precious metal.

Figure 6A:
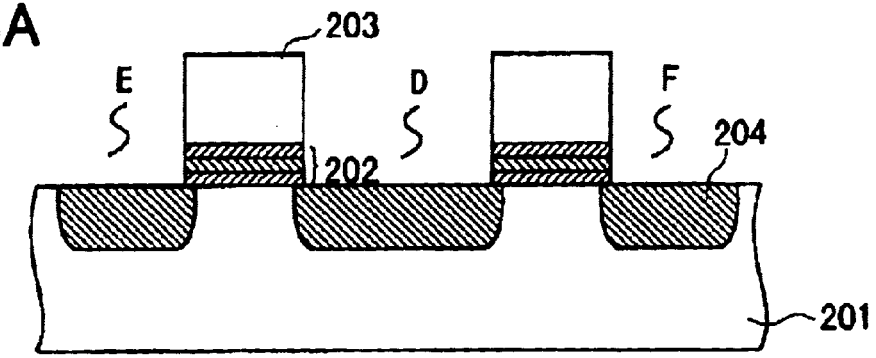
FIGS. 6A to 6C are cross sectional views showing schematically a section through a line A–A' in FIG. 5, in a sequence in which manufacturing steps using a manufacturing method according to the embodiment of the present invention are performed.
Figure 6B:
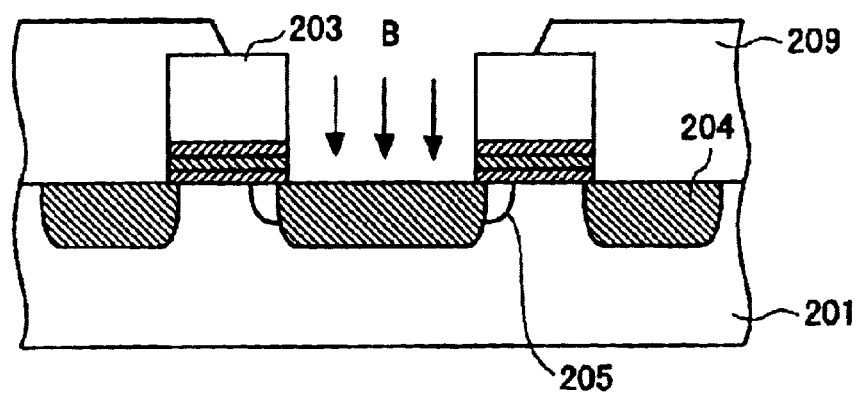

In the embodiment of the present invention, ends of the second diffusion regions immediately under the first and second gate electrodes include respective impurity regions (205 in FIG. 6(B)) of an opposite polarity to the diffusion regions.

In the embodiment of the present invention, impurity regions (207 in FIG. 7C) with a lower impurity concentration than the diffusion regions and of a same polarity as the diffusion regions are included at the ends of the first and third diffusion regions immediately under the first and second gate electrodes.

Figure 8A:
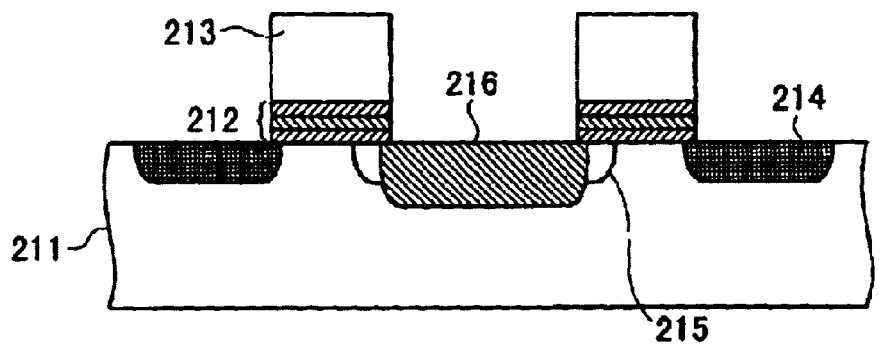
FIGS. 8A to 8C are cross sectional views showing schematically a cross section through the line A–A' in FIG. 5, in the sequence in which manufacturing steps using a manufacturing method according to still other embodiment of the present invention are performed.
Figure 8B:
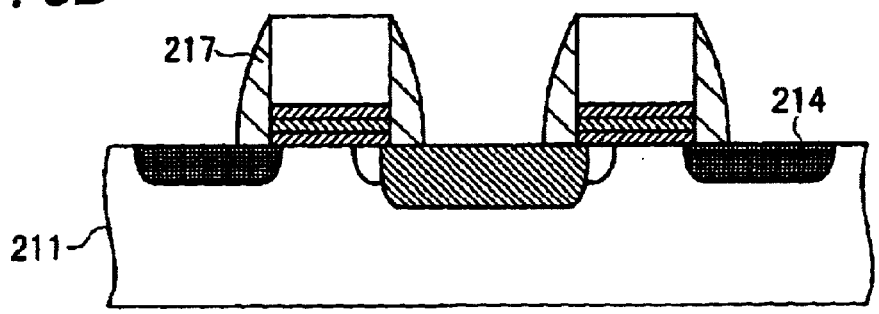
Figure 8C:
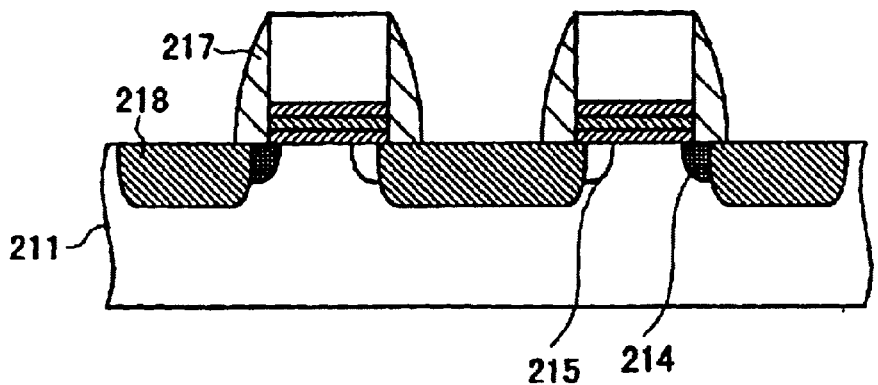

In the present invention, the ends of the second diffusion region immediately under the first and second gate electrodes include respective first impurity regions (214 in FIG. 8C) of a same conductivity type as the diffusion regions, and the ends of the first impurity regions include second impurity regions of the opposite polarity to the diffusion regions (215 in FIG. 8C).

In the present invention, between the ends of the second diffusion region immediately under the first and second gate electrodes and the first and third diffusion regions, impurity regions (231 in FIG. 15) of the opposite polarity to the diffusion regions are included.

Figure 3:
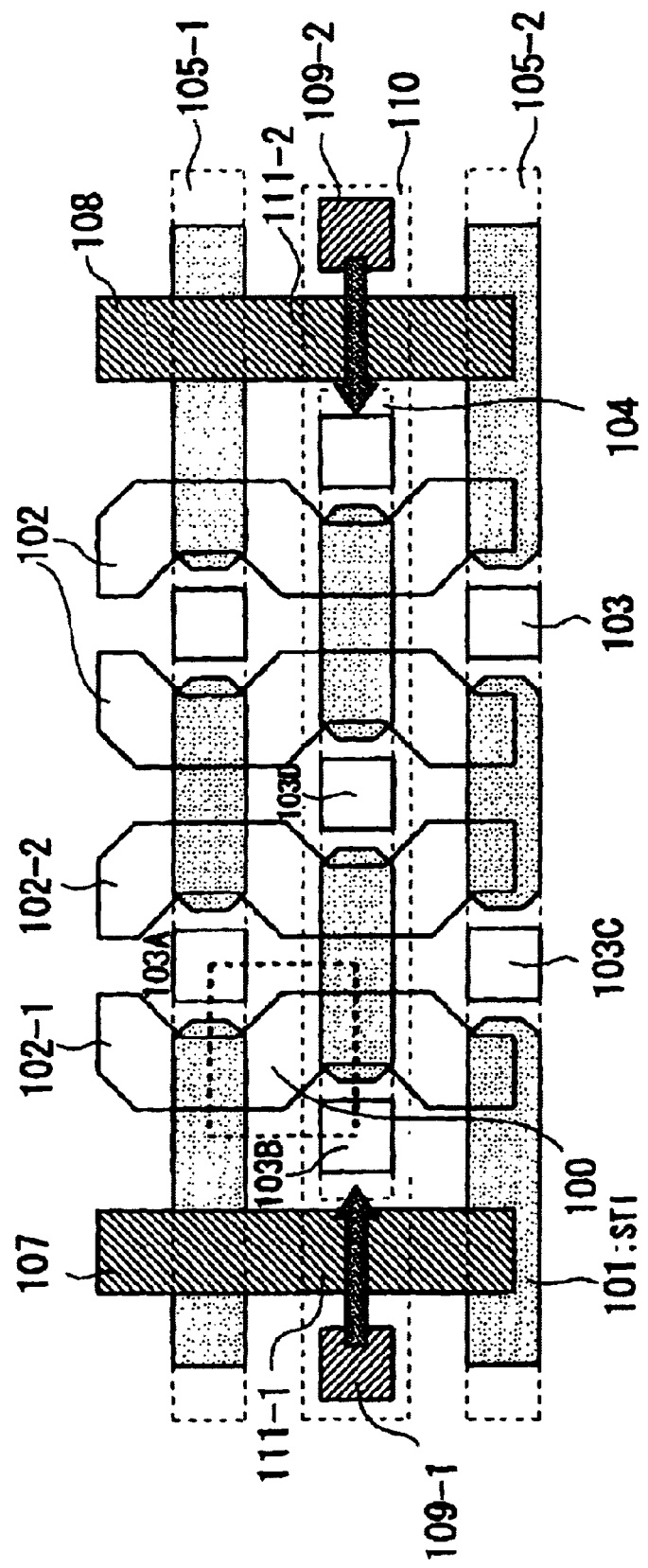
FIG. 3 is a layout diagram showing a configuration of a memory cell array according to the embodiment of the present invention.
Figure 4:
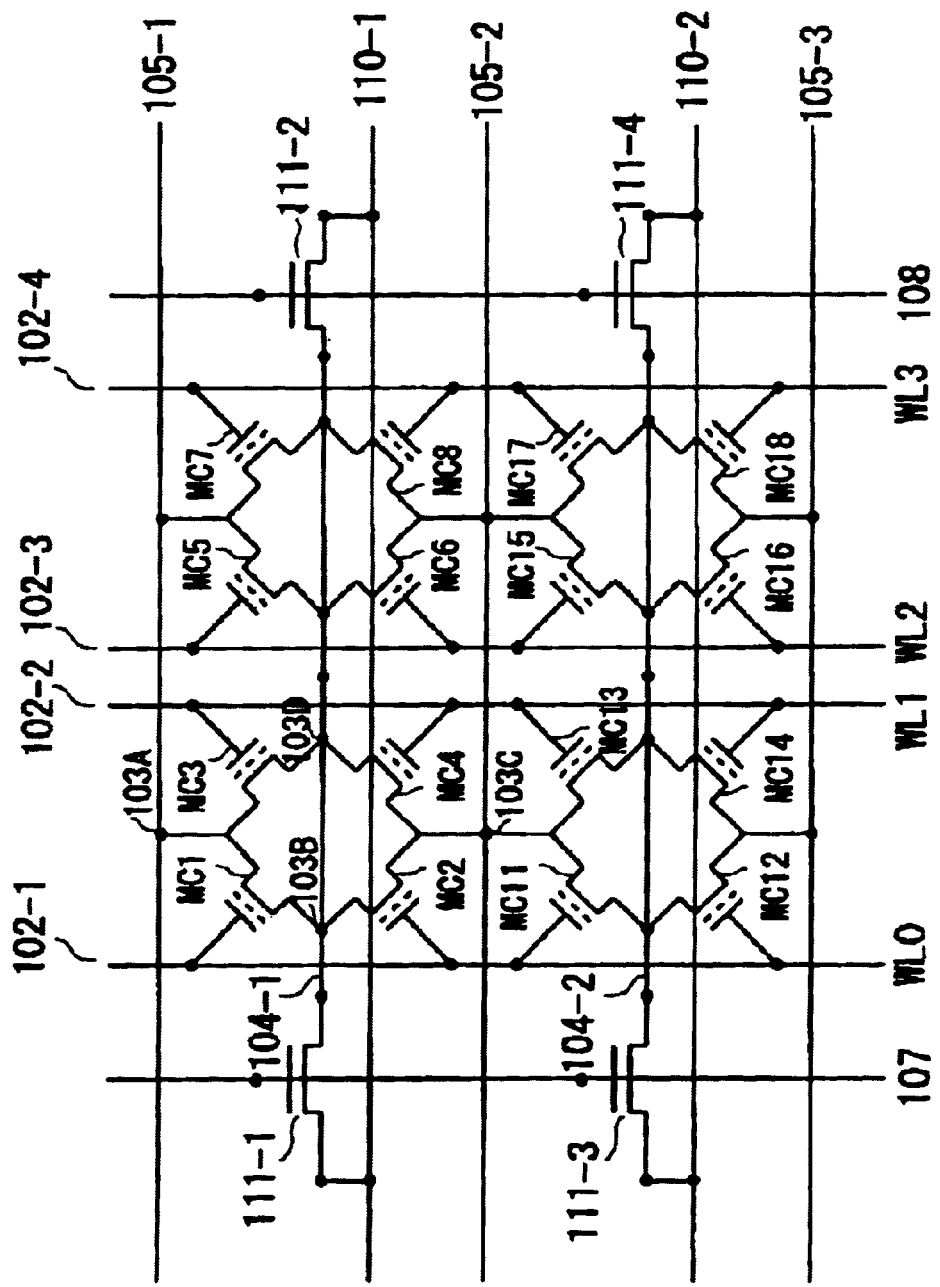
FIG. 4 is a diagram showing an equivalent circuit of the memory array in FIG. 3 according to the embodiment of the present invention.

Referring to FIGS. 3 and 4, a semiconductor memory device memory cell array of the present invention, in its preferred mode, includes at least first through fourth diffusion regions provided in four regions located on vertexes of a rectangle in the surface of the substrate for a cell array region including a plurality of memory cells so that the diffusion regions are spaced to one another. The first and third diffusion regions are mutually located on a first diagonal line, and the second and fourth diffusion regions are located on a second diagonal line perpendicular to the first diagonal line. The memory cell array includes at least a first insulating film provided on the substrate between the first and second diffusion regions, a first gate electrode provided on the first insulating film, a second insulating film provided on the substrate between the second and third diffusion regions, a second gate electrode provided on the second insulating film, a third insulating film provided on the substrate between the third and fourth diffusion regions, a third gate electrode provided on the third insulating film, a fourth insulating film provided on the substrate between the fourth and first diffusion regions, and a fourth gate electrode provided on the fourth insulating film. A memory cell transistor constituted from the first and second diffusion regions, first insulating film, and first gate electrode constitutes a first memory cell (MC1). A memory cell transistor constituted from the second and third diffusion regions, second insulating film, and second gate electrode constitutes a second memory cell (MC2) adjacent to the first memory cell. A memory cell transistor constituted from the third and fourth diffusion regions, third insulating film, and third gate electrode constitutes a third memory cell (MC3) adjacent to the second memory cell. A memory cell constituted from the fourth and first diffusion regions, fourth insulating film, and fourth gate electrode constitutes a fourth memory cell (MC4) adjacent to the respective first and third memory cells. The first and second gate electrodes are connected in common to form a first word line (102-1), while the third and fourth gate electrodes are connected in common to form a second word line (102-2). The first diffusion region is connected to a first read bit line (105-1) disposed to cross over the first and second word lines on a layer overlying the substrate via a contact (103A), while the second and fourth diffusion regions are connected in common to a common second program and erase bit line (104) disposed to cross over the first and second word lines on the layer overlying the substrate via contacts (103B, 103D), respectively. The third diffusion region is connected to a third read bit line (105-2) disposed to three-dimensionally cross the first and second word lines on the layer overlying the substrate via a contact (103C).

When writing to a memory cell is performed, a program voltage is applied from both ends of the second program and erase bit line (104 in FIG. 3) in the longitudinal direction, connected to the diffusion regions of the memory cell via the contacts (103B and 103D).

Figure 16:
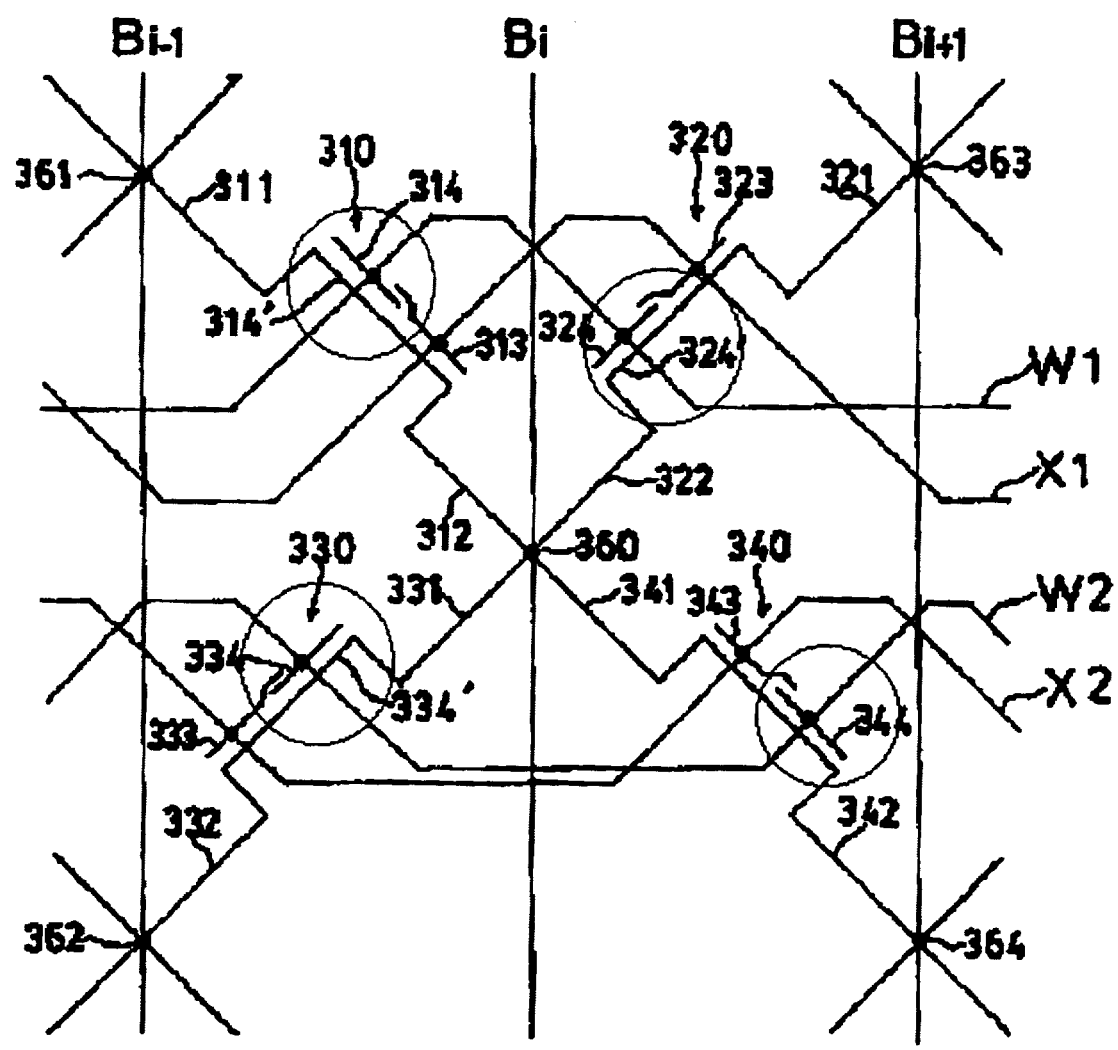
FIG. 16 is a diagram showing a conventional semiconductor memory device circuit.
Figure 17:
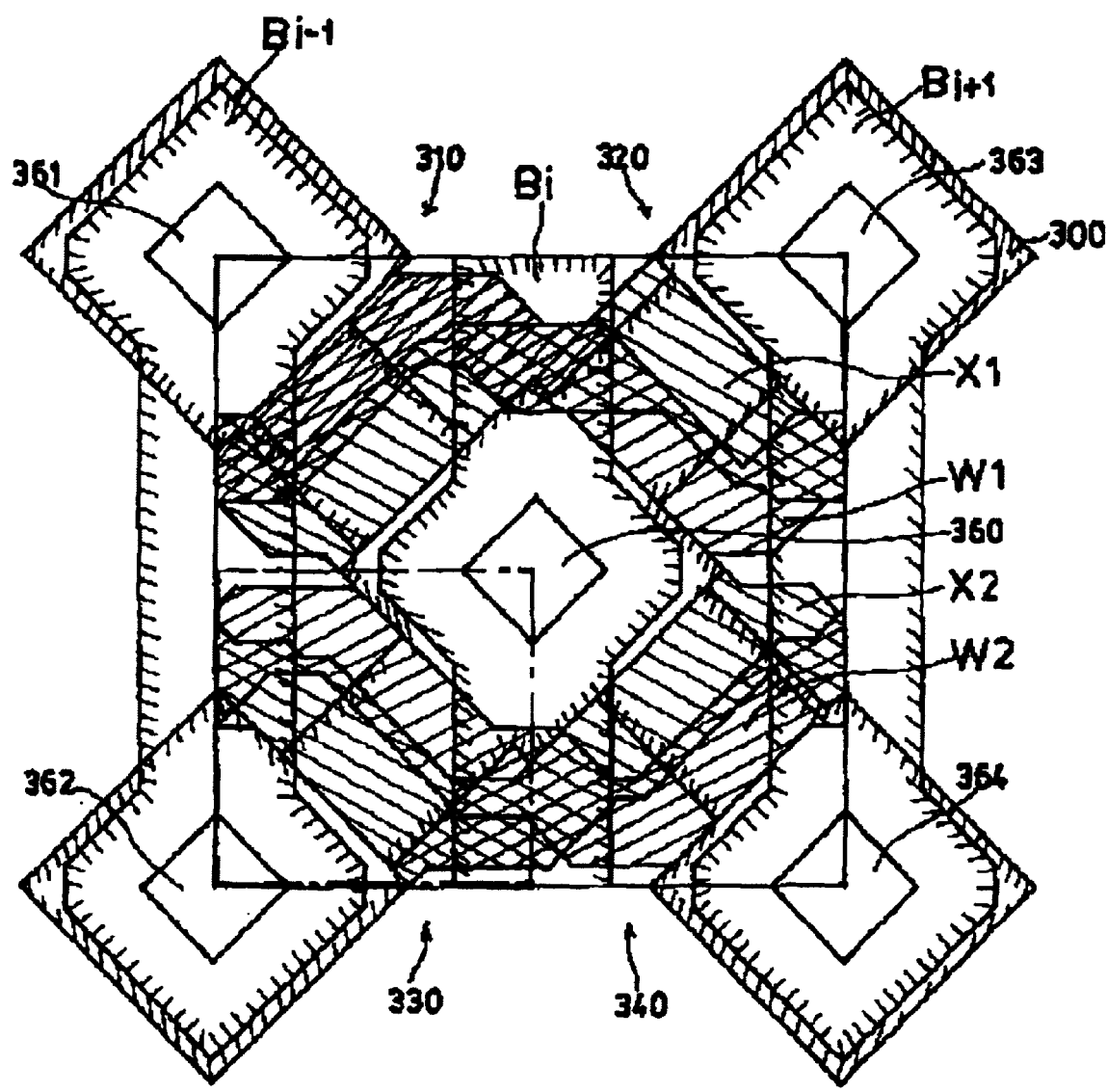
FIG. 17 is a diagram showing a layout of the conventional semiconductor memory device in FIG. 16.
Figure 18:
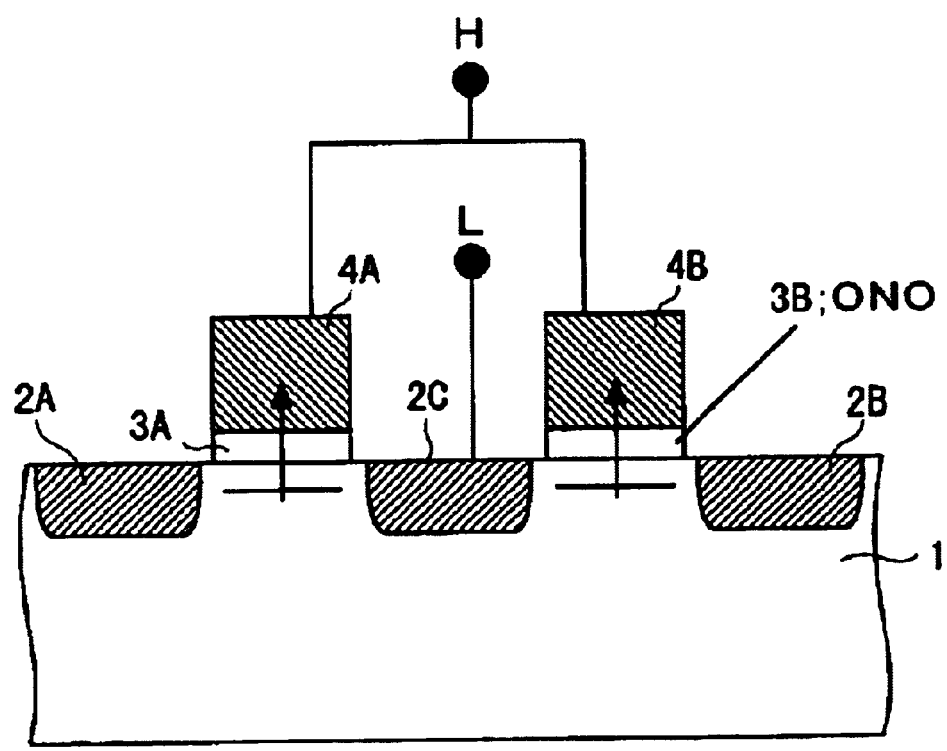
FIG. 18 is a diagram for explaining a problem of the conventional semiconductor memory device.
Figure 19:
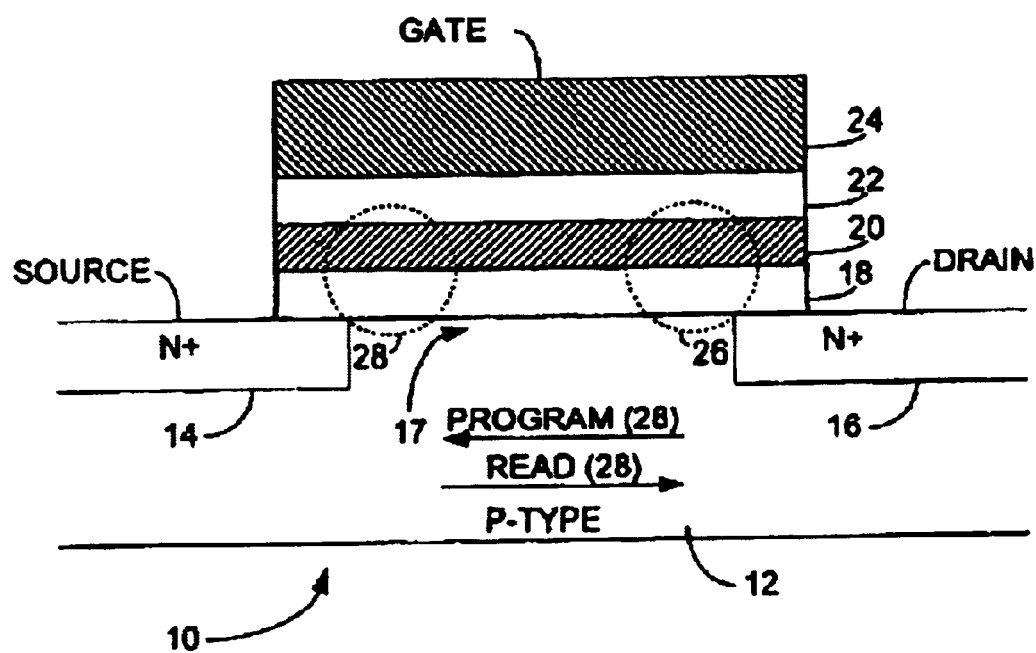
FIG. 19 is a diagram showing a configuration of a conventional semiconductor memory device.

In an X cell of a MONOS type according to the present invention, configured as described above, an address selection transistor for a memory cell according to a prior art described with reference to FIGS. 16 and 17 becomes unnecessary. The X cell having a one-transistor-per-memory-cell configuration which allows gate electrode wiring to be formed of a single layer of polysilicon is thus realized, thereby facilitating manufacture.

According to the present invention, by performing writing to a cell to be programmed in the X cell of the MONOS type by channel hot electrons, writing to the cell to be programmed can be performed separately from writing to a cell adjacent to the cell to be programmed.

Figure 11A:
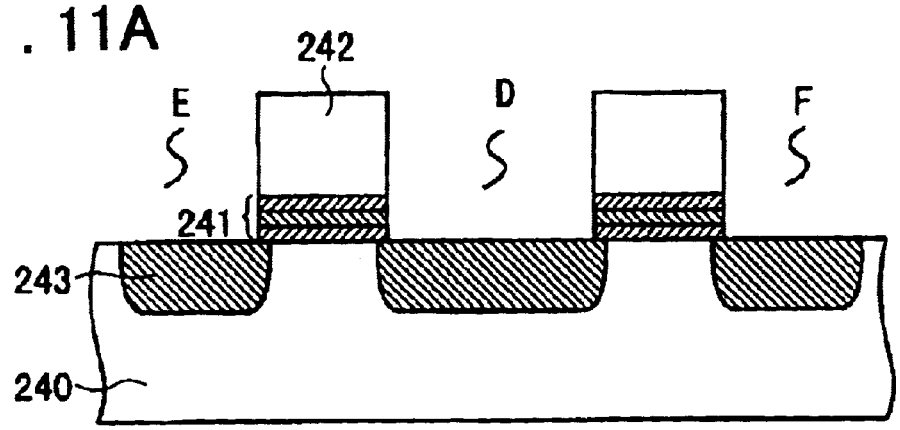
FIGS. 11A to 11C are cross sectional views showing schematically a cross section in FIG. 10 in the sequence in which manufacturing steps using a manufacturing method according to an embodiment of the present invention are performed.

A manufacturing method according to an embodiment mode of the present invention includes the steps of:

(a) forming an insulating film and gate electrodes on a substrate, and then forming diffusion regions by doping an impurity into the surface of the substrate with the gate electrodes that have been patterned employed as masks, the gate electrodes including first and second gate electrodes, the diffusion regions including first to third diffusion regions (243 in FIG. 11A) and being respectively formed in a first region on one side of the first gate electrode, a second region between the first electrode and the second gate electrode located on an opposite side to the one side of the first gate electrode, and a third region located opposite to the second region for the second gate electrode;

(b) forming an impurity region (244 in FIG. 11B) of a polarity opposite to the second diffusion region at the end of the second diffusion region immediately under at least one gate electrode of the first and second gate electrodes;

(c) covering the substrate with an insulating film and removing the insulating film by etch-back, thereby forming spacers (245 in FIG. 11C) made of the insulating film on side walls of the first and second gate electrodes; and (d) depositing a metal film over the substrate for silicidation to form a metal silicide layer (246 in FIG. 12A) on the surfaces of the gate electrodes and the diffusion regions. A memory cell transistor including the first and second diffusion regions, the insulating film under the first gate electrode fabricated in the step described above, and the first gate electrode constitutes the first memory cell. A memory cell transistor including the second and third diffusion regions, the insulating film under the second gate electrode, and the second gate electrode constitutes the second memory cell. The first and second gate electrodes are connected in common to form a word line.

Figure 12A:
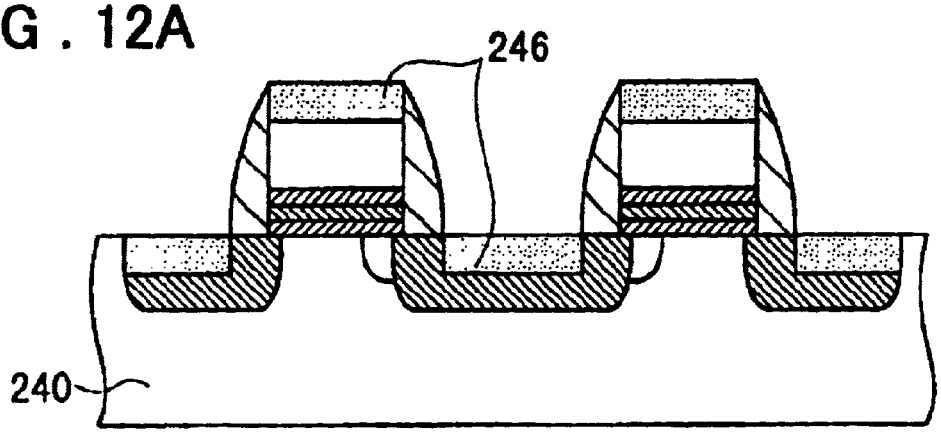
FIGS. 12A to 12C are cross sectional views schematically showing the section in FIG. 10 in the sequence in which manufacturing steps using the manufacturing method according to the embodiment of the present invention are performed.
Figure 12B:
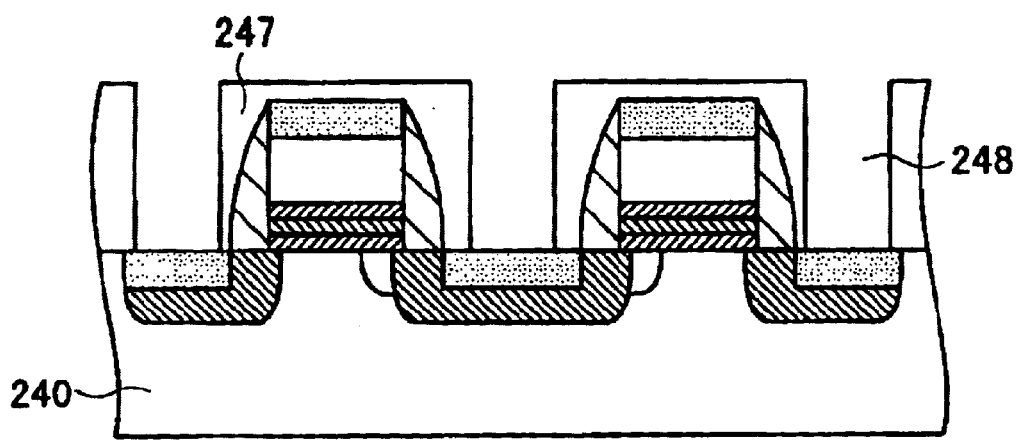
Figure 12C:
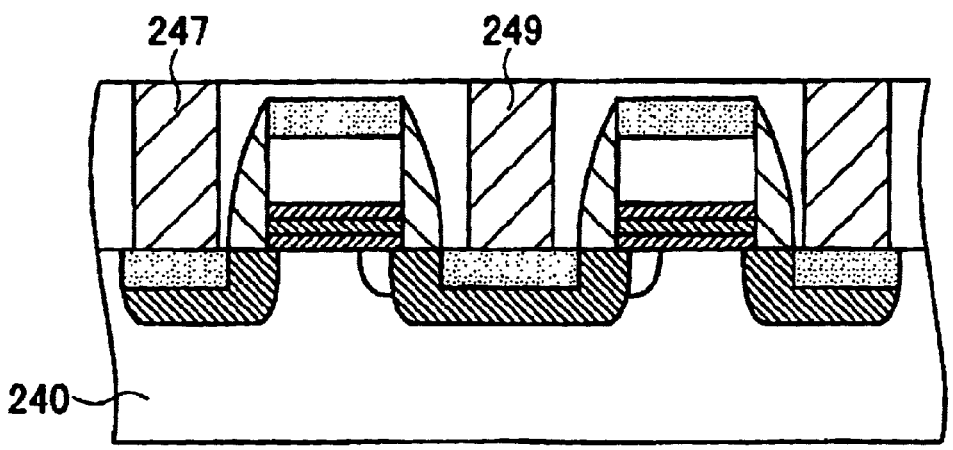

The manufacturing method according to this embodiment mode further includes the steps of:

(e) covering the substrate with an insulating film (247 in FIG. 12(B) to open first to third contact openings (248 in FIG. 12B)) at locations for the first to third diffusion regions; and (f) filling a conductive material (249 in FIG. 12(C)) into the first to third contact openings. The first and third diffusion regions are connected to the first and third bit lines (105-1, 105-2 in FIG. 10) disposed on the layer overlying the substrate, respectively, and the second diffusion region is connected to the second bit line (104 in FIG. 10) disposed on the layer overlying the substrate via the contact.

A manufacturing method according to other embodiment mode of the present invention includes the step of:

forming an impurity region (207 in FIG. 7C) with a lower concentration than any of the diffusion regions and of the same polarity as the diffusion regions at an end of at least one of the first diffusion region immediately under the first gate electrode and the third diffusion region immediately under the second gate electrode.

A manufacturing method according to other embodiment mode of the present invention includes the step of:

forming an impurity region (231 in FIG. 15) of the opposite polarity to the diffusion regions in at least one of the surface of the substrate between the first and second diffusion regions immediately under the first gate electrode and the surface of the substrate between the second and third diffusion regions immediately under the second gate electrode.

A manufacturing method according to other embodiment mode of the present invention includes the steps of:

(a) forming an insulating film and gate electrodes on a substrate, and then forming impurity regions with a relatively low concentration with the gate electrodes (213 in FIG. 8A) that have been patterned employed as masks, the gate electrodes including first and second gate electrodes adjacent to each other, the impurity regions (214 in FIG. 8A) with the relatively low concentration being respectively formed in at least first and third regions among the first region located on one side of the first gate electrode, a second region located between the first electrode and the second gate electrode located on an opposite side to the one side of the first gate electrode, the third region located on an opposite side to the second region for the second gate electrode, forming a second diffusion region (216 in FIG. 8A) in the second region between the first and second gate electrodes adjacent to each other, and forming an impurity region (215 in FIG. 8A) of the opposite polarity to the second diffusion region at the end of the second diffusion region immediately under at least one gate electrode of the first and second gate electrodes;

(b) covering the substrate with an insulating film and removing the insulating film by etch-back, thereby forming spacers (217 in FIG. 8B) made of the insulating film on side walls of the first and second gate electrodes; and (c) forming first and third diffusion regions (218) in the first and third regions in the surface of the substrate, respectively.

A manufacturing method according to other embodiment mode of the present invention includes the steps of:

(a) forming an insulating film and gate electrodes on the substrate, and then forming impurity regions with a relatively low concentration with the gate electrodes that have been patterned employed as masks, the gate electrodes including first and second gate electrodes adjacent to each other, the impurity regions (214 in FIG. 9A) with the relatively low concentration being respectively formed in a first region located on one side of the first gate electrode, a second region between the first electrode and the second gate electrode located on an opposite side to the one side of the first gate electrode, and a third region located on an opposite side to the second region for the second gate electrode, and forming an impurity region (215 in FIG. 9A) of the opposite polarity to the impurity regions at the end of the impurity region immediately under at least one gate electrode of the first and second gate electrodes;

(b) covering the substrate with an insulating film and removing the insulating film by etch-back, thereby forming spacers (217 in FIG. 9B) on side walls of the first and second gate electrodes; and (c) forming first to third diffusion regions (218 in FIG. 9C) in the first to third regions in the surface of the substrate. By the steps described above, first and second impurity regions of the same polarity as the diffusion regions and with the relatively low concentration are included immediately under the spacers (217) on the side walls of the first gate, being adjacent to the first and second diffusion regions. Third and fourth impurity regions of the same polarity as the diffusion regions and with the relatively low concentration are included immediately under the spacers on the sidewalls of the second gate, being adjacent to the second and third diffusion regions. Fifth and sixth impurity regions of the opposite polarity to the second and third impurity regions are formed, being adjacent to the second and third impurity regions at both ends of the second diffusion region (refer to FIG. 9C).

A manufacturing method according to other embodiment mode of the present invention further includes the step of:

forming impurity regions (225 in FIG. 13B) of the opposite polarity to the diffusion regions at the end of the first diffusion region immediately under the first gate electrode and at the end of the third diffusion region immediately under the second gate electrode.

A manufacturing method according to other embodiment mode of the present invention further includes the step of:

forming impurity regions (227 in FIG. 14C) of the opposite polarity to the diffusion regions so as to be adjacent to the first impurity region provided adjacent to the first diffusion region immediately under the first gate electrode and the fourth impurity region provided adjacent to the third diffusion region immediately under the second gate electrode.

In order to describe the present invention described above in further detail, embodiments of the present invention will be described with reference to drawings.

Figure 1B:
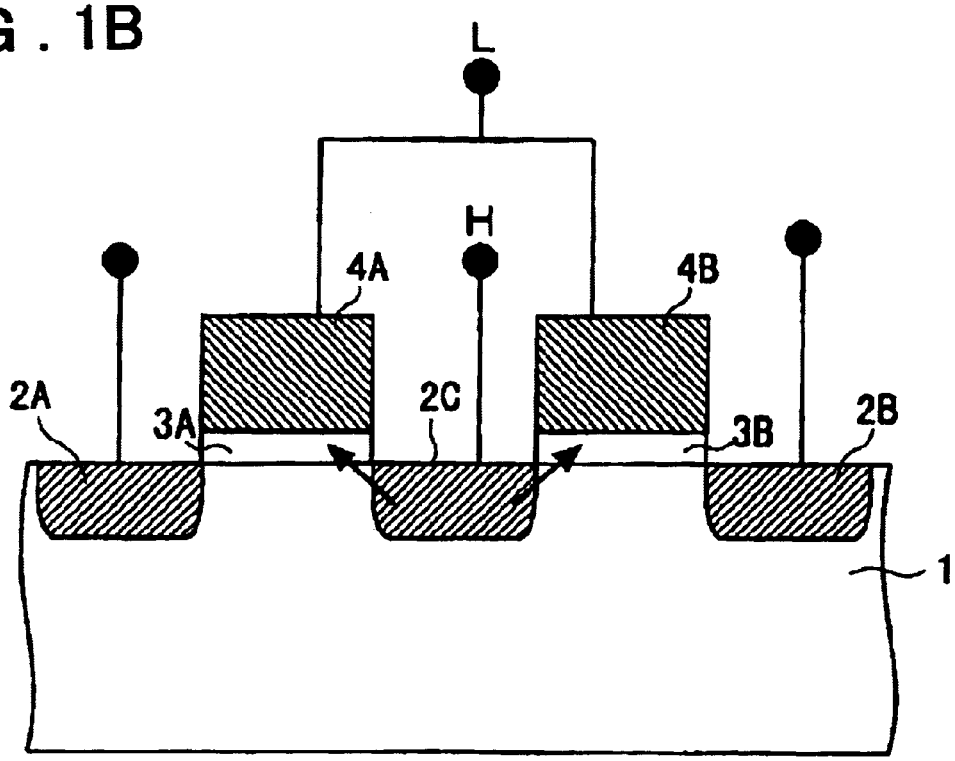
FIG. 1B is a diagram for explaining the principle underlying the present invention.

FIGS. 1A and 1B show diagrams for explaining the configuration of a memory cell according to an embodiment of the present invention. There are schematically shown cross sections of adjacent two memory cells in an X cell consisting of four memory cells that share a single contact region and laid out in an X pattern, a center of which is the contact region. More specifically, FIG. 1A shows an example of bias setting at the time of programming, while FIG. 1B shows an example of bias setting at the time of erasing.

Referring to FIG. 1A, each memory cell is configured using a single transistor. A sectional configuration of two adjacent memory transistors are schematically shown in FIG. 1A. Diffusion regions 2A and 2C, an insulating film 3A, and a gate electrode 4A constitute one memory cell transistor, and the diffusion region 2C and a diffusion region 2B, a insulating film 3B, and a gate electrode 4B constitute other memory cell transistor. The gate electrodes 4A and 4B of the two memory cells are connected to a common word line. The diffusion regions 2A and 2B are used as respective terminals (contacts) dedicated to reading, while the diffusion region 2C shared by two memory cells is used as a programming/erasing terminal (contact).

By setting a word line to a high voltage (H), a bit line connected to the drain diffusion region 2C of a first memory cell to be programmed to M (a predetermined positive voltage lower than H), a bit line connected to the source diffusion region 2A to L (a ground potential), and a bit line connected to the diffusion region 2B of a second memory cell not to be programmed to M, channel hot electrons are generated, and electrons are injected into the insulating film 3A of the first memory cell to be programmed.

Next, erasing will be described with reference to FIG. 1B. In this embodiment, by performing erasing by hot hole injection, adjacent cells can be erased simultaneously. By setting the gate electrodes 4A and 4B of the first and second memory cells to L (the ground potential and a negative voltage), and the drain diffusion region 2C to a high voltage (H) in FIG. 1B, hot holes are neutralized with charges of electrons which are trapped in the insulating films 3A and 3B. Preferably, potentials of the diffusion regions 2A and 2B are set to a ground level at this point. Further, preferably, the insulating films 3A and 3B each are composed by a ONO film which is constituted from a silicon dioxide film, a silicon nitride film provided on the silicon dioxide film, and a silicon dioxide film provided on the silicon oxide film.

Figure 2:
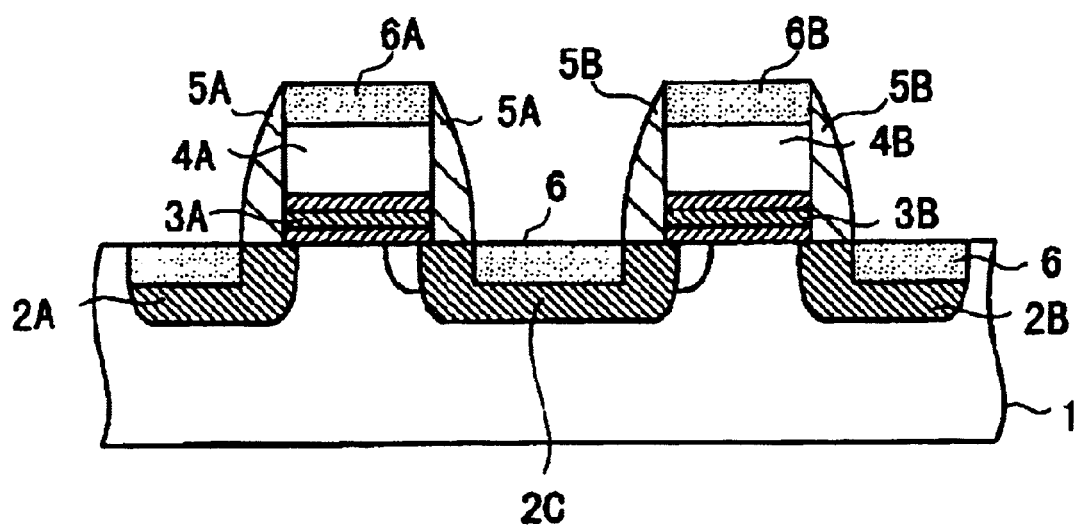
FIG. 2 is a sectional view showing configurations of memory cells according to an embodiment of the present invention.

FIG. 2 is a diagram showing a cross section of two adjacent memory cells according to the embodiment of the present invention. As shown in FIG. 2, by making the gate electrodes 4A and 4B a single-layered polycrystalline silicon structure, which are respectively formed on the ONO films 3A and 3B on a P-type silicon substrate 1, formation of metal silicide layers 6A and 6B of the gate electrodes using a refractory metal or a semi-precious metal and formation of a metal silicide layer 6 for a diffusion region used as a contact are facilitated. According to the present invention with a configuration described above, an affinity for a logic process (where gates and diffusion region contacts are silicided) can be improved, and hence the present invention can be employed for use as an embedded flash memory.

Next, a configuration of a memory cell array according to an embodiment of the present invention will be described. FIG. 3 is a diagram showing a layout example of the memory cell array according to the embodiment of the present invention. Referring to FIG. 3, the cell array with MONOS transistors thereof laid out in X patterns is provided with bank selection gates 107 and 108 on both sides thereof, thereby forming banks. Referring to FIG. 3, reference numeral 101 denotes a device isolation trench (Shallow Trench Insulator) provided in the substrate. Reference numerals 102 denote a gate electrode (also termed as "silicide gate") having a surface silicided, as shown in FIG. 2. Reference numeral 110 denotes a global program/erase (metal) bit line routed on a second aluminum interconnection layer (2A1), and connected to one of source and drain diffusion regions of bank selection transistors 111-1 and 111-2 via a through hole/contact 109-1 and a through hole/contact 109-2. The bank selection transistors 111-1 and 111-2 have the bank selection gates 107 and 108 as their gate electrodes. Reference numeral 104 denotes a program/erase (metal) bit line provided on a first aluminum interconnection layer (1A1), and connected to the other of the source and drain diffusion regions of the bank selection transistors 111-1 and 111-2 via contacts 103. Reference numerals 105-1 and 105-2 denote read only metal bit lines interconnected on the first aluminum interconnection layer (1A1), and are connected to the diffusion regions of the memory cells via the contacts 103. In the cell array, the read only bit lines 105-1 and 105-2, read/erase only metal bit line 104, and global program/erase only metal bit line 110 are disposed, being orthogonal to the silicide gates (word line electrodes) 102 composing word lines.

A memory cell transistor comprising a diffusion region connected to the read only metal bit line 105-1 via contact 103A, a diffusion region connected to the program/erase only metal bit line 104 via contact 103B, and gate electrode 102-1 constitutes a unit cell 100.

A description will be directed to a layout pattern of the silicide gates 102. Gate 102-1 disposed so that a layer underlying the read only metal bit line 105-1 is orthogonal to the read only metal bit line 105-1 in the unit cell 100 is bent in a right direction of the drawing once so that it is orthogonal to a virtual line which connects the contacts 103A and 103B positioned opposite to each other in a slanting direction of the drawing. Then, the gate 102-1 is extended, and bent in an opposite direction again to be disposed so that a layer underlying the program/erase only metal bit line 104 is orthogonal to the program/erase only metal bit line 104.

Next, a program operation in the memory array according to this embodiment will be described. When programming is performed, a high voltage is applied to the global program/erase only metal bit line 110 on the second aluminum interconnection layer (2A1). Further, the bank selection transistors 111-1 and 111-2 on both sides of the cell array are turned on, and a program voltage is transferred to the program/erase only metal bit line 104 in a bank. As shown in FIG. 3 by arrows, the program currents can be increased by making a channel width of each of the bank selection transistors 111-1 and 111-2 wide. In addition, since the program currents are supplied from the bank selection transistors 111-1 and 111-2 on both sides, the insufficient supply of the program current does not occur.

Next, an erase operation in the memory array according to this embodiment will be described. The ground potential or the negative voltage is applied to the word line connected to a target memory cell. A positive erase voltage is applied to the global program/erase only metal bit line 110. Then, the bank selection transistors 111-1 and 111-2 are turned on, thereby performing selection of a bank. Then, a positive erase voltage is applied to the program/erase only metal bit line 104 in the bank. Hot holes are then generated to neutralize electrons trapped in the insulating film of the memory cell, thereby performing erasing.

Next, a circuit configuration of the cell array of which the layout was shown in FIG. 3 will be described. FIG. 4 is a diagram illustrating an equivalent circuit of a partial circuit shown in FIG. 3. While FIG. 4 shows a configuration of four word lines, two program/erase only metal bit lines, and three read only metal bit lines for simplicity of description, the present invention is not of course limited to this configuration. Referring to FIG. 4, the bank selection transistors 111-1 and 111-2 are provided. Ones of the source and drain diffusion regions of the bank selection transistor 111-1 and 111-2 are connected to the global program/erase only metal bit line (metal bit line) 110-1 on the second aluminum interconnection layer (2A1) via the contacts. The others of the source and drain diffusion regions of the bank selection transistors 111-1 and 111-2 are connected to a program/erase only metal bit line 104-1 in the bank via the contacts, and the gates of the bank selection transistors 111-1 and 111-2 are connected to the bank selection lines 107 and 108, respectively.

The program/erase only metal bit line 104-1 and a program/erase only metal bit line 104-2 in the bank are disposed in a region between the read only metal bit line 105-1 and the read only metal bit line 105-2 and a region between the read only metal bit line 105-2 and the read only metal bit line 105-3, respectively on the first aluminum interconnection layer (1A1).

A memory cell MC1 which has a gate electrode connected to a word line WL0, one of drain and source diffusion regions thereof connected to the read only metal bit line 105-1 via the contact 103A, and the other of the drain and source diffusion regions thereof connected to the program/erase only metal bit line 104-1 via the contact 103B constitutes a unit cell. Likewise, a memory cell MC2 which has a gate electrode connected to the word line WL0, one of drain and source diffusion regions thereof connected to the read only metal bit line 105-2 via a contact 103C, and the other of the drain and source diffusion regions connected in common with the memory cell MC1 to the program/erase only metal bit line 104-1 via the contact 103B constitutes the unit cell.

A memory cell MC3 which has a gate electrode compose by a word line WL1, one of drain and source diffusion regions connected in common with the memory cell MC1 to the read only metal bit line 105-1 via the contact 103A, and the other of the drain and source diffusion regions connected to the program/erase only metal bit line 104-1 via a contact 103D constitutes the unit cell. A memory cell MC4 which has a gate electrode connected to the word line WL1, one of drain and source diffusion regions thereof in common with the memory cell MC2 connected to the read only metal bit line 105-2 via the contact 103C, and the other of the drain and source diffusion regions connected in common with the memory cell MC3 to the program/erase only metal bit line 104-1 via the contact 103D constitutes the unit cell. In this manner, four memory cells MC1 to MC4 are disposed between the adjacent word lines WL0 and WL1 and between the mutually adjacent read only metal bit lines 105-1 and 105-2. Each of these cells constitutes one transistor for which writing and reading can be performed individually.

Likewise, a memory cell MC5 which has a gate electrode connected to a word line WL2, one of drain and source diffusion regions connected to the read only metal bit line 105-1, and the other of the drain and source diffusion regions connected to the program/erase only metal bit line 104-1, a memory cell MC6 which has a gate electrode connected to the word line WL2, one of drain and source diffusion regions thereof connected to the read only metal bit line 105-2, and the other of the drain and source diffusion regions connected in common with the memory cell MC5 to the program/erase only metal bit line 104-1, a memory cell MC7 which has a gate electrode connected to a word line WL3, one of drain and source diffusion regions thereof connected to the read only metal bit line 105-1, and the other of the drain and source diffusion regions connected to the program/erase only metal bit line 104-1, a memory cell MC8 which has a gate electrode connected to the word line WL3, one of drain and source diffusion regions thereof connected to the read only metal bit line 105-2, and the other of the drain and source diffusion regions connected in common with the memory cell MC7 to the program/erase only metal bit line 104-1 respectively constitute unit cells.

Four adjacent memory cells MC3, MC4, MC5, and MC6 share one contact 103D, and these four cells are laid out in the X pattern, a center of which is the contact 103D. Likewise, the memory cells MC2 and MC4 connected between the program/erase only metal bit line 104-1 and the read only metal bit line 105-2 with their gate electrodes connected to the word lines WL0 and WL1, respectively, and memory cells MC11 and MC13 connected between the read only metal bit line 105-2 and the program/erase only metal bit line 104-2 with their gate electrodes connected to the word lines WL0 and WL1, respectively, share one contact 103C. These four cells are laid out in the X pattern, being centered on this contact.

Four adjacent memory cells MC6, MC8, MC15, and MC17 share one contact connected to the read only metal bit line 105-2, and these four cells are also laid out in the X pattern, a center of which is the contact. Four adjacent memory cells MC13, MC14, MC15, and MC16 share one contact connected to the program/erase only metal bit line 104-2, and these four cells are also laid out in the X pattern, being centered on this contact.

Figure 5:
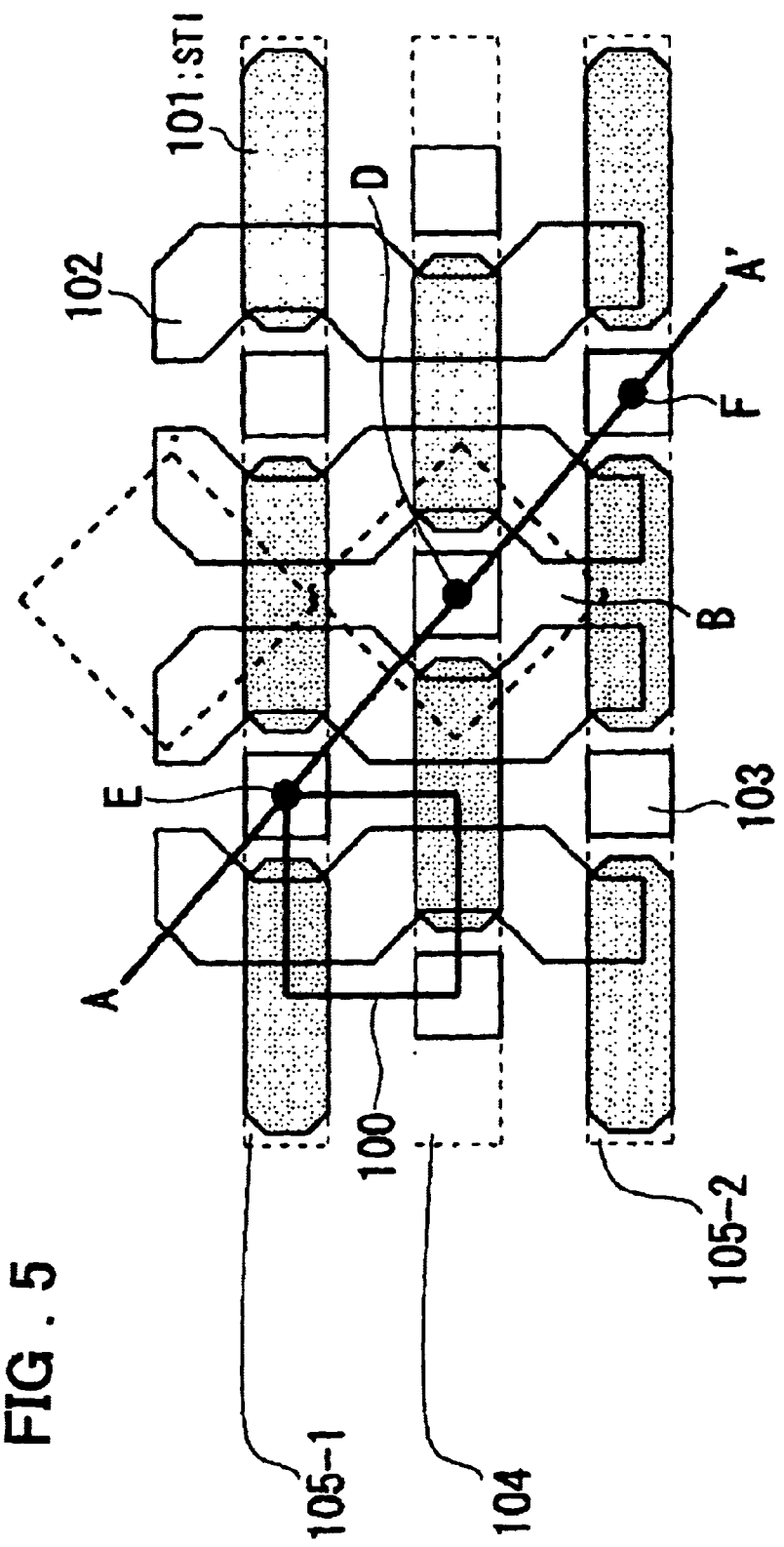
FIG. 5 is a layout diagram showing an embodiment of the present invention.

Next, a method of manufacturing a MONOS flash memory of an X-cell type according to an embodiment of the present invention will be described with reference to FIGS. 5 and 6. FIG. 5 is a diagram showing a part of a layout pattern of the MONOS flash memory of the X-cell type. FIGS. 6A to 6C are cross sectional views showing steps, which illustrate a cross section through a line A–A' (a line through contact regions E, D, and F) in FIG. 5 in a sequence in which manufacturing steps are performed. Incidentally, FIGS. 6A to 6C are divided just for convenience in preparing the drawings. Referring to FIG. 5, the gate electrodes 102, contacts 103, program/erase only metal bit line 104, read only metal bit lines 105-1 and 105-2 are provided on the P-type silicon substrate through the STI (Shallow Trench Insulator) device isolator 101 and the ONO films (not shown). The unit cell is denoted by reference numeral 100 in the drawing. As described before, the program/erase only metal bit line 104 is provided on the first aluminum interconnection layer (1A1) and connected to the diffusion regions of the memory cells via the contacts 103. The read only metal bit lines 105-1 and 105-2 are provided on the first aluminum interconnection layer (1A1) and connected to the diffusion regions of the memory cells via the contacts 103.

Referring to FIG. 6A, polycrystalline silicon films that will become ONO films 202 and gate electrodes 203 are formed on a P-type silicon substrate 201 sequentially. Thereafter, N-type diffusion regions 204 which will become sources and drains are formed by ion implantation with the patterned gate electrodes 203 employed as masks (refer to FIG. 6A.

Next, boron ions are implanted with a photoresist 209 as a mask to form P-type pocket implantation regions 205 immediately under the gate electrodes 203 in a contact region D (corresponding to a region B in FIG. 5) connected to the program/erase only metal bit line (refer to FIG. 6(B)). An implantation energy of the boron ions is set to such a value as 15 Kev as an example, while a dose amount is set to such as value as 3E13 cm$^{-2}$ as an example. Horizontal and vertical spreading of the impurity layers is achieved by a heat treatment for activating an impurity (under conditions such as at 800° C., for 10 minutes, and in a nitrogen atmosphere). For formation of the P-type pocket implantation regions 205, oblique ion implantation may be employed. Preferably, spreading of an impurity of boron or phosphor through the source/drain diffusion regions 204 is set to approximately 10 nm to 100 nm, as an example. The ion implantation for the P-type pocket implantation regions 205 can also serve as an LDD (Lightly Doped Drain) implantation for transistors. The P-type pocket implantation regions 205 are provided to enhance program and erase efficiencies.

Figure 6C:
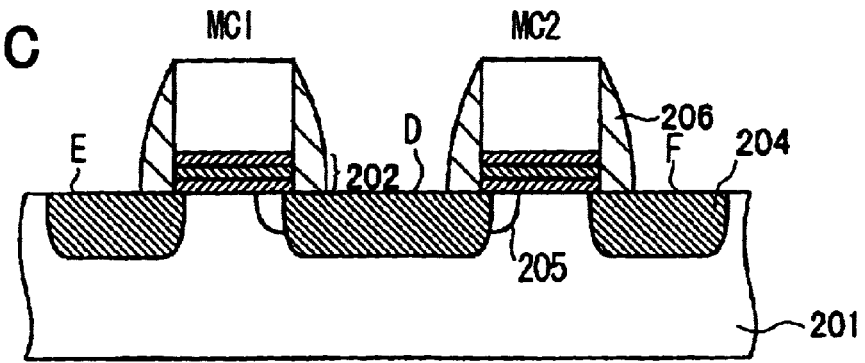

Next, after the photoresist 209 has been removed, side-wall spacer insulating films 206 for the gates are formed (refer to FIG. 6C). By depositing the silicon oxide film over an entire surface of the substrate by a CVD method and then etching back the silicon oxide film for removal to expose the surfaces of the gate electrodes 203, for example, side-wall spacers are formed. Then, the refractory metal or the semi-precious metal is deposited for silicidation. Silicide layers are thereby formed on the surfaces of the gate electrodes and the contact regions.

Figure 7A:
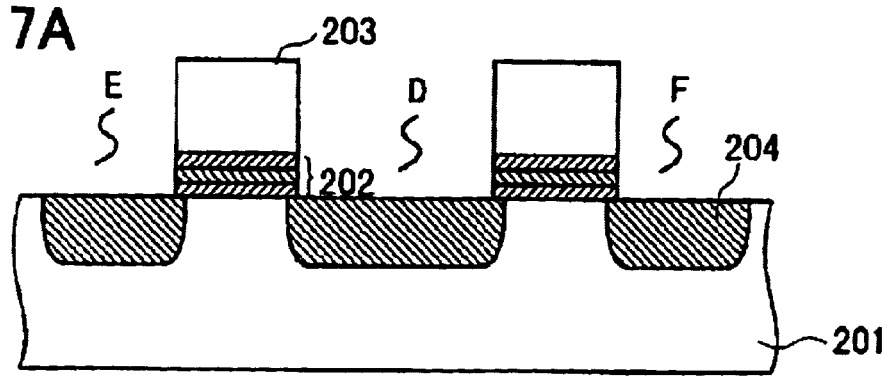
FIGS. 7A to 7D are cross sectional views showing schematically a cross section through the line A–A' in FIG. 5, in the sequence in which manufacturing steps using a manufacturing method according to other embodiment of the present invention are performed.
Figure 7B:
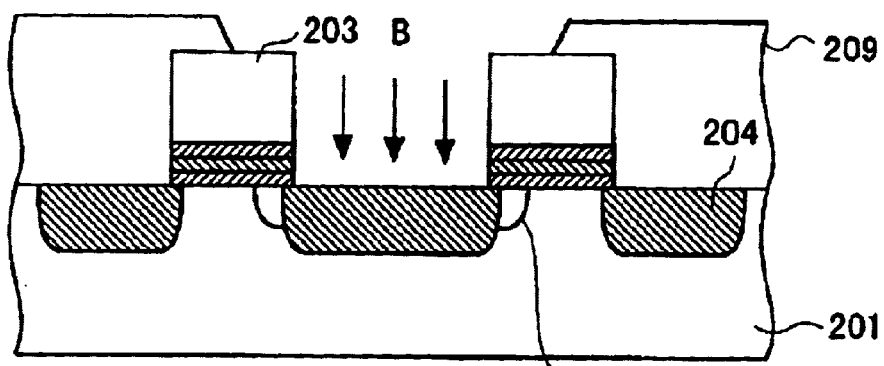

A manufacturing method as shown in FIGS. 7A through 7D is also applied to manufacture of a semiconductor memory device according to the present invention. FIG. 7A shows the same step as in FIG. 6A.

Next, the boron ions are implanted with the photoresist 209 as the mask to form the P-type pocket implantation regions 205 immediately under the terminals of the gate electrodes 203 in the region D (corresponding to the region B in FIG. 5) connected to the program/erase only metal bit line (refer to FIG. 7B) via the contact. Since this is the same as the step in FIG. 6B, the detailed explanation is omitted.

Figure 7C:
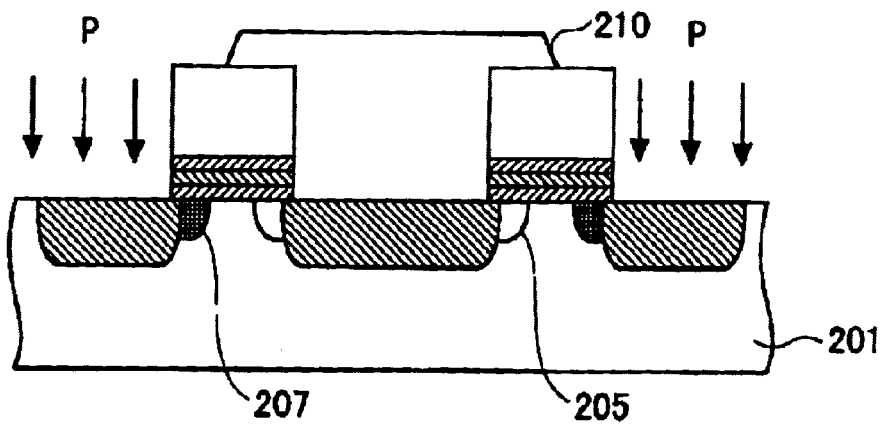
Figure 7D:
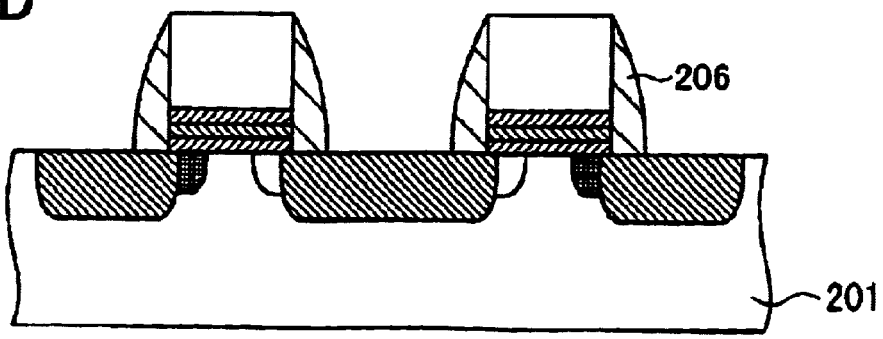

Next, the photoresist 209 is removed, and N-type pocket implantation layers 207 are formed immediately under the gate electrodes 203 in the N-type diffusion region regions connected to the read only metal bit lines via the contacts (refer to FIG. 7C). If phosphor ions are employed, ion implantation is performed with the implantation energy of 30 Kev and the dose amount of 3E13 cm$^{-2}$ as an example.

Formation of the N-type pocket implantation layers 207 (ion implantation) may serve as the LDD implantation for peripheral transistors not shown such as a sensing amplifier transistor. The N-type pocket implantation layers 207 are provided to alleviate an electric field generated in the diffusion region under a terminal when reading is performed, thereby suppressing electron injection into the ONO film 202.

Next, other manufacturing method according to an embodiment of the present invention will be described with reference to FIGS. 8A to 8C and FIGS. 9A to 9C. A difference between memory cells formed according to a manufacturing flow shown in FIGS. 7A to 7D and the manufacturing flow shown in FIGS. 8A to 8C and FIGS. 9A to 9C is that the formation of N-type diffusion regions 218 for read only terminals (the contacts connected to the read only metal bit lines) by ion implantation is performed after the formation of side-wall spacers 217.

ONO films 212 and the polycrystalline silicon films that will constitute the gate electrodes are deposited on the substrate, and low-concentration N+ impurity regions 214 are formed, with patterned gate electrodes 213 employed as masks. Then, implantation of the boron ions is performed with a photoresist not shown as a mask to form P-type pocket implantation regions 215 immediately under the gate electrodes 213 in a region 216 in contact with the program/erase only metal bit line. Further, a diffusion region 216 for the contact region D connected to the program/erase only metal bit line is fabricated (refer to FIG. 8A). Formation of the P-type pocket implantation regions 215 is performed in the same manner as in the step in FIG. 6B.

Next, the side-wall spacers 217 (simply termed "spacers") are formed on the side walls of the gates (refer to FIG. 8B).

Thereafter, N-type diffusion regions 218 for the read only terminals are formed (refer to FIG. 8C). At this point, the N-type pocket diffusion regions 214 have been formed in the surface of the substrate immediately under the sidewall spacers 217.

As shown in FIG. 8C, by providing the N-type pocket implantation layers 214, an electric field generated in the N-type diffusion region 218 for the read only terminal when reading is performed can be further reduced. For this reason, electron injection into the ONO film 202 can be sufficiently suppressed.

Figure 9A:
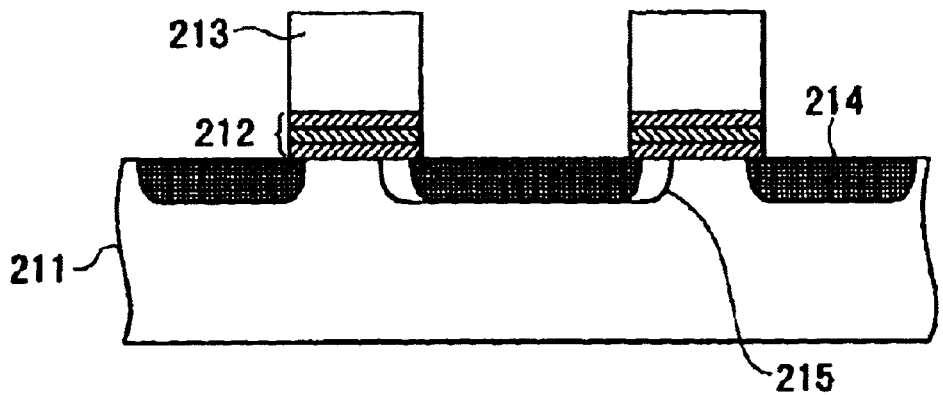
FIGS. 9A to 9C are corss sectional views showing schematically a cross section through the line A–A' in FIG. 5, in the sequence in which manufacturing steps using a manufacturing method according to still other embodiment of the present invention are performed.

Next, a manufacturing method according to other embodiment of the present invention will be described with reference to FIGS. 9A to 9C.

The ONO film 212 and the polycrystalline silicon film are deposited on the substrate, and the low-concentration N+ impurity region 214 is formed, with the patterned gate electrodes 213 employed as a mask. Then, with a photoresist not shown as a mask, the P-type pocket implantation region 215 is formed immediately under the gate electrode 213 on the side of the region 216 in contact with the program/erase only metal bit line (refer to FIG. 9A).

Figure 9B:
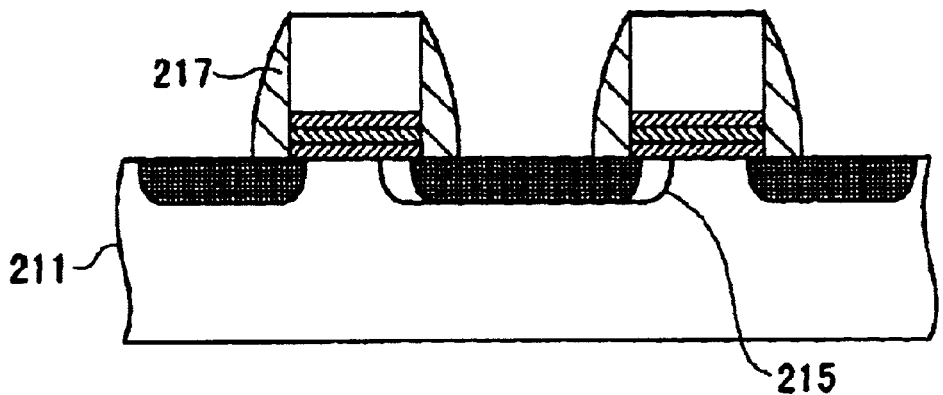
Figure 9C:
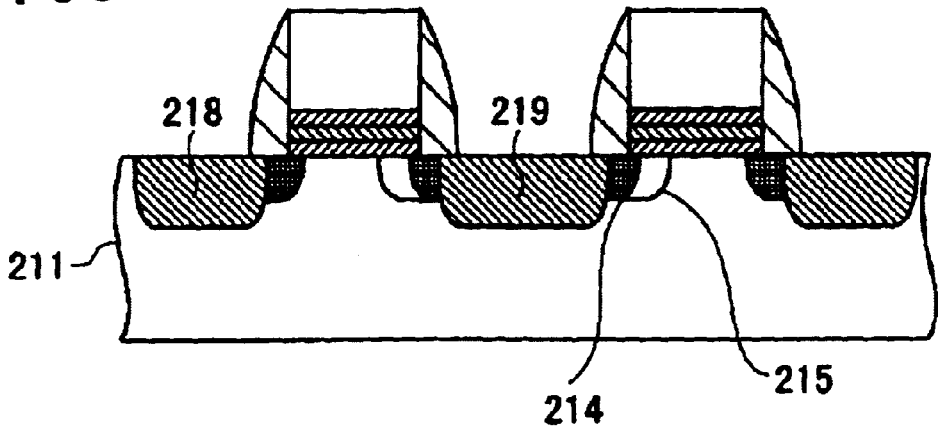

Next, a sidewall spacers 217 are formed on side walls of the gate (refer to FIG. 9B).

Thereafter, the N-type diffusion region 218 for the read only terminal is formed (refer to Fig. C). At this point, the N-type pocket implantation layer 214 has been formed in the surface of the substrate immediately under the sidewall spacers 217.

Read only terminal structure of the memory cell formed according to this manufacturing flow are the same as shown in FIG. 8. However, at the program/erase only terminal (a contact region connected to the program/erase only metal bit line), the N-type pocket implantation layer 214 is formed inside the P-type pocket implantation regions 215, and the N-type diffusion region 218 is formed after formation of the side-wall spacer 217. The N-type pocket implantation layer 214 is formed in the surface of the substrate immediately under the sidewall spacer 217.

With this arrangement, as compared with the configuration shown in FIG. 8C, an injection region of hot electrons into the ONO film 212 can be formed closer to end of the gate electrode 213. For this reason, a memory cell gate length can be reduced.

Figure 10:
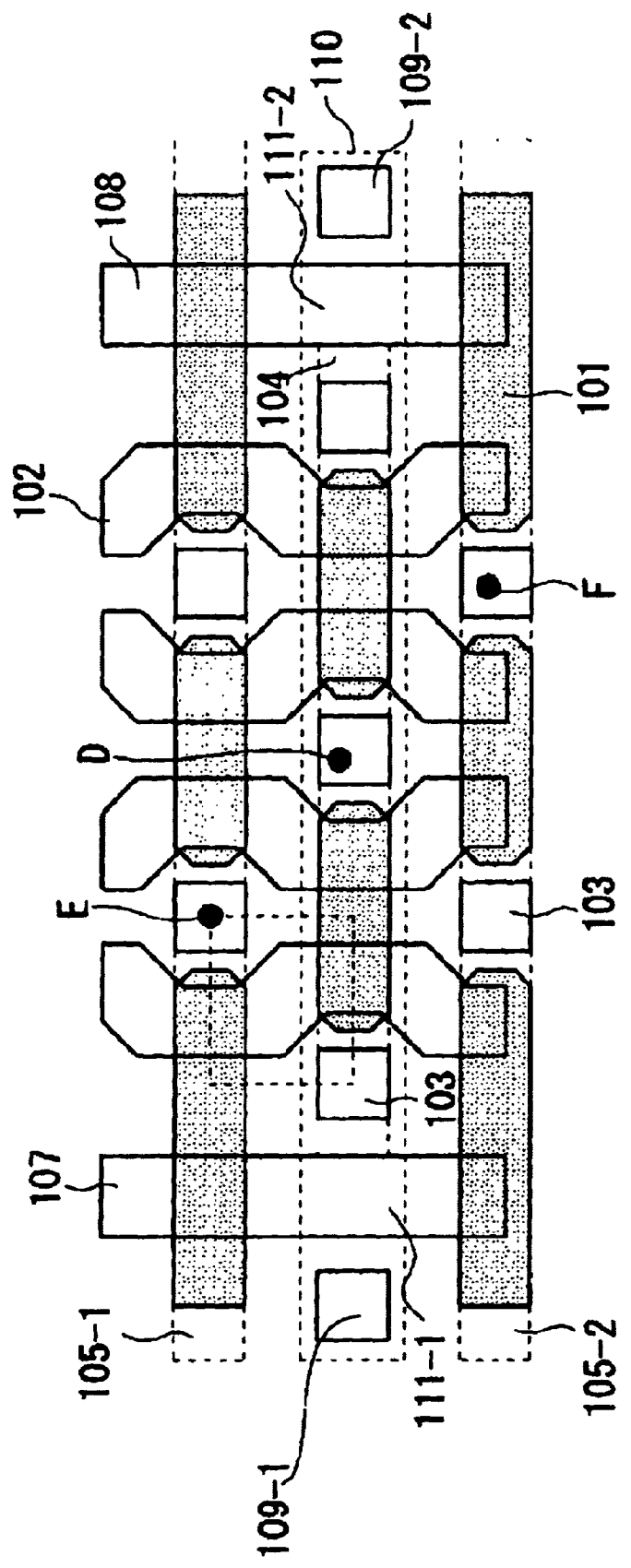
FIG. 10 is a layout diagram showing a configuration of a memory cell array according to an embodiment of the present invention.

FIG. 10 is a diagram showing a layout configuration of a memory cell array according to an embodiment of the present invention, and is made to be the same as the layout configuration shown in FIG. 3, for explanation of writing. More specifically, the bank selection gates 107 and 108 are included at both ends of the memory cell array, and the global program/erase only metal bit line 110 electrically connected to the program/erase only metal bit line 104 for each bank through the bank selection transistors 111-1 and 112 is included. The global program/erase only metal bit line 110 is provided on the second aluminum interconnection layer.

Memory cells sandwiched between the bank selection gate 107 and 108 disposed at both sides of a plurality of the memory cell gate electrodes 102 constitute a bank.

When programming and erasing operations are performed, a predetermined voltage is applied to a memory cell in each bank through the bank selection transistors 111-1 and 112 when the bank selection transistor 111-1 and 111-2 at both sides are selected and a predetermined voltage are applied. For this reason, the channel width of the bank selection transistors 111-1 and 111-2 equivalently doubled. A current driving capability is thereby doubled, so that programming and erasing operational characteristics are not impaired.

Adjacent banks not shown are disposed on opposite sides of the through hole/contacts 109 of the bank selection transistor.

In the banks not selected, the potentials of the bank selection gates 107 and 108 are set to the ground potential. Thus, the global program/erase only metal bit line 110 and the program/erase only metal bit line 104 in the banks are disconnected, so that no program/erase voltage is applied to memory cells thereof.

Next, program, erase, and read operations on a memory cell in the memory cell array according to the embodiment of the present invention will be described using specific bias voltages as examples.

First, the program operation according to the embodiment of the present invention will be described. A MONOS memory according to the present invention uses channel hot electrons. Referring to FIG. 10, the predetermined voltage such as 8V is applied to the bank selection gates 107 and 108 to turn on the bank selection transistors. A high voltage such as 9V is applied to the gate electrode 102 of a memory cell to be programmed.

Further, a program pulse voltage, such as a pulse at a voltage of 5V, for example, is applied to the program/erase only metal bit line 104 for $1\mu$ second.

Referring to FIGS. 6 and 10, the program pulse voltage applied to the program/erase only metal bit line 104 is transferred to the N-type diffusion region 204 in the contact region D. Since the P-type pocket implantation region 205 is formed in the N-type diffusion region 204 at a point D, the efficiency of generating channel hot electrons is enhanced.

In order to program selectively either one of the two memory cell transistors (MC1 and MC2 see FIG. 6C) formed on both sides of the N-type diffusion region 204 at the point D, the N-type diffusion region 204 at a point E is set to the ground potential, and a program inhibit voltage such as 5V is applied to the N-type diffusion region 204 at a point F.

With this arrangement, channel hot electrons are injected into the ONO film 202 of the memory cell transistor MC1 sandwiched between the N-type diffusion regions at the points D and E and a threshold voltage of the memory cell transistor MC1 is increased. In the case of a MONOS memory device of which the structure of the ONO film 202 is comprised of a 5-nm-thick tunnel silicon oxide film, a 5-nm-thick silicon nitride film, and a 6-nm-thick top silicon oxide film, its threshold increases by approximately 2V, as compared with an initial threshold, under the above mentioned program condition.

Next, the erase operation according to the embodiment of the present invention will be described. The erase operation according to the embodiment of the present invention uses hot hole injection.

Referring to FIG. 10, a predetermined voltage such as 8V is applied to the bank selection gates 107 and 108 to select a bank.

A ground voltage or a negative voltage such as −6V is applied to the word line (gate electrode) 102 connected to a memory cell for which erasure is performed.

Further, an erase pulse voltage, such as a pulse at a voltage of 5V is applied to the program/erase only metal bit line 104 for approximately 10 ms. At this point, the read only metal bit lines 105-1 and 105-2 are held at the ground level.

Referring to FIGS. 6 and 10, the erase pulse voltage applied to the program/erase only metal bit line 104 is transferred to the N-type diffusion region 204 at the contact region D.

Since the P-type pocket implantation region 205 is formed in the N-type diffusion region 204 at the point D, the efficiency of generating band-to-band hot holes is enhanced.

At this point, electrons stored in the ONO films 202 in two memory cell transistors which share the N-type diffusion region 204 at the point D by a preceding program operation are neutralized with the holes injected.

If preprogramming is performed on memory cells to which programming has not been performed before the erase operation, a phenomenon of excessive hole injection is suppressed, so that program/erase cycle endurance is improved.

Next, a read operation of a memory cell in the memory array according to the embodiment of the present invention will be described. In order to perform reading the memory cell, two methods are possible. Referring to FIG. 10, a predetermined voltage such as 3V is applied to the bank selection gates 107 and 108 to turn on the bank selection transistor 111-1 and 111-2 for selecting a bank.

A positive voltage such as 3V is applied to the word line (gate electrode 102) connected to the memory cell from which reading is performed.

In a first method of reading, the ground potential is applied to the program/erase only metal bit line 104, and a read voltage is applied to the read only metal bit line 105-1 (or 105-2). At this point, the read only metal bit line 105-2 (or 105-1) to which the read voltage is not applied is set to the ground potential. An advantage of this method is that this method can be applied to the structure described with reference to FIGS. 6 through 9, without alteration.

In a second method of reading, the read voltage such as 1V is applied to the program/erase only metal bit line 104, and the ground potential is applied to the read only metal bit line 105-1 or 105-2 adjacent to the program/erase only metal bit line 104, for a memory cell transistor from which reading is performed. The read only metal bit line 105-2 (or 105-1) for memory cell transistors from which reading is not performed is made open or the read voltage is applied to the read only metal bit line 105-2 (or 105-1). A sense amplifier (not shown) connected to the read only metal bit lines determines whether the memory cell from which reading is to be performed is the cell to which writing has been performed or not, according to a magnitude of current that passes between the source and the drain of the memory cell transistor.

In other words, since electrons are trapped in the ONO 202 film (refer to FIG. 6) of the memory cell which has been programmed, the threshold value of the memory cell increases to approximately 4V, so that a channel of the memory cell transistor is not turned on.

If the second method of reading is employed, the read voltage applied to the global program/erase only metal bit line 110 is transferred to the program/erase only metal bit line 104 through the bank selection transistors 111-1 and 111-2. For this reason, a substantial interconnection capacity of the global program/erase only metal bit line 110 can be reduced, which is therefore effective for high-speed reading.

As described before, channel hot electron injection is employed as programming, and hot hole injection is employed as erasing. X-cell type MONOS memories using single-layer gate electrodes can be thereby constituted. For this reason, the consistency with the salicide process can be readily made.

FIGS. 11A to 11C and FIGS. 12A to 12C are diagrams showing a manufacturing method according to an embodiment of the present invention in a sequence in which manufacturing steps are performed. Referring to FIGS. 11A to 12C, the manufacturing method according to the embodiment of the present invention will be described. FIGS. 11A to 12C are divided just for convenience in preparing the drawings.

After an ONO film 241 and a polycrystalline silicon film that will become a gate electrode have been formed on a P-type silicon substrate 240, pattern formation is performed to form a gate electrode 242. Thereafter, N-type diffusion regions 243 for sources and drains are formed (refer to FIG. 11A).

Figure 11B:
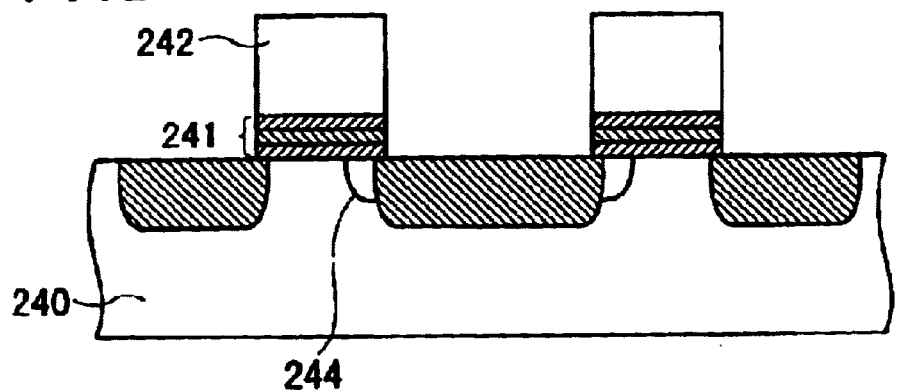

Next, a P-type pocket implantation region 244 for facilitating the program operation is formed on the side of the program/erase terminal (the diffusion region 204 at the D having the contact connected to the program/erase only metal bit line 104 in FIG. 10) (refer to FIG. 11B). The P-type pocket implantation region 244 does not always need to be formed. The P-type pocket implantation region 244 enhances the generation efficiency of hot holes at the time of the erase operation.

Figure 11C:
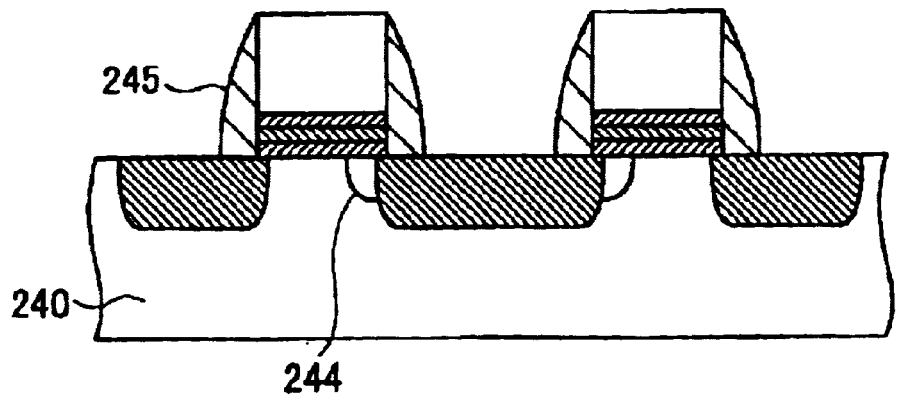

Next, sidewall spacers 245 are formed on the side walls of the gates (refer to FIG. 11C). For the formation of the sidewall spacers 245, a known method is employed where a silicon oxide film has been deposited by CVD or the like and then removed by etch-back. While processes up to this stage employ the manufacturing method described with reference to FIG. 6, the manufacturing method described with reference to FIGS. 7, 8, or 9 may be of course employed.

Thereafter, using a known method, silicidation is performed on the gate electrode 242 and the N-type diffusion region 243 with the refractory metal or semi-precious metal (such as Co) to form a silicide layer 246 (refer to FIG. 12A).

Next, after an interlayer insulating film 247 has been formed, a contact opening 248 is formed if necessary (refer to FIG. 12B).

Furthermore, a conductive material such as tungsten is filled into the contact opening to form a plug 249 connected to a metal interconnection (the read only metal bit line 105 and program/erase only metal bit line 104 on the first aluminum interconnection layer in FIG. 10 and the like) which will be formed on an overlaying layer in the future (refer to FIG. 12C). Thereafter, the second aluminum interconnection layer (not shown) is formed through an insulating film, and the global program/erase only metal bit line is provided on the second aluminum interconnection layer. One of the source and drain diffusion regions of the bank selection transistors 111-1 and one of the source and drain diffusion regions of the bank selection transistors 111-2 in FIG. 10 are connected to the global program/erase only metal bit line on the second aluminum interconnection layer via a contact/through hole.

The above-mentioned U.S. Pat. No. 6,256,231 B1 and the like are known as a technique for storing 2-bit information (memory nodes) in one memory transistor. By applying this known method to the present invention, a noticeable effect can be expected.

That is, a principal problem of the prior art U.S. Pat. No. 6,256,231 B1 is that since wiring resistance of the N-type diffusion region that form the source and the drain is great, it is difficult to normally perform write and erase operations on a memory cell. When this known art is employed, a resistance of about 10 K ohm is generated on the source and the drain. Considering that an on-resistance of a memory cell transistor (a resistance between the source and drain when the memory cell is in an on state) is approximately 10 K ohm when a program operation is performed on the memory cell, the parasitic resistance of the source and the drain and the on-resistance of the memory transistor would become almost equivalent.

As described before, when the program operation is performed on a memory cell, it is necessary to apply a pulse voltage of 5V to the N-type diffusion region.

However, as shown in the known example, the parasitic resistances of the source and the drain are equivalent to the on-resistance of the memory cell transistor, it substantially becomes necessary to apply double the pulse voltage or 10V. For this reason, a charge pump and a circuit for high voltage application become large, thereby greatly affecting manufacturing costs.

On contrast therewith, in the present invention, the parasitic resistances of the source and the drain can be appreciably reduced, the problem that a charge pump circuit and the circuit for high voltage application become large to greatly affect the manufacturing costs does not arise.

As described above, according to the present invention, following effects are achieved:

(1) Memory cell size can be reduced.

(2) Since salicidation is made easy, the parasitic resistance can be reduced, so that a voltage necessary for the program operation can be reduced. A circuit area of such as the charge pump and the like can be reduced.

Figure 13A:
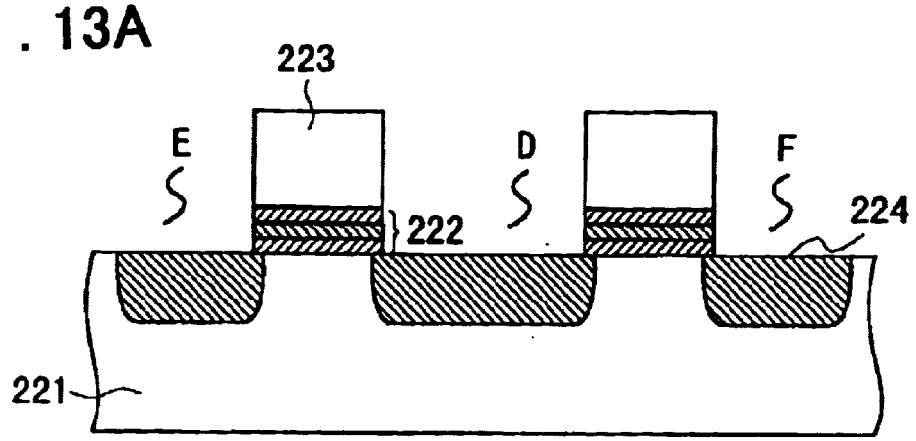
FIGS. 13A to 13C are cross sectional views showing schematically a cross section in FIG. 10 in the sequence in which manufacturing steps using a manufacturing method according to an embodiment of the present invention are performed.
Figure 13B:
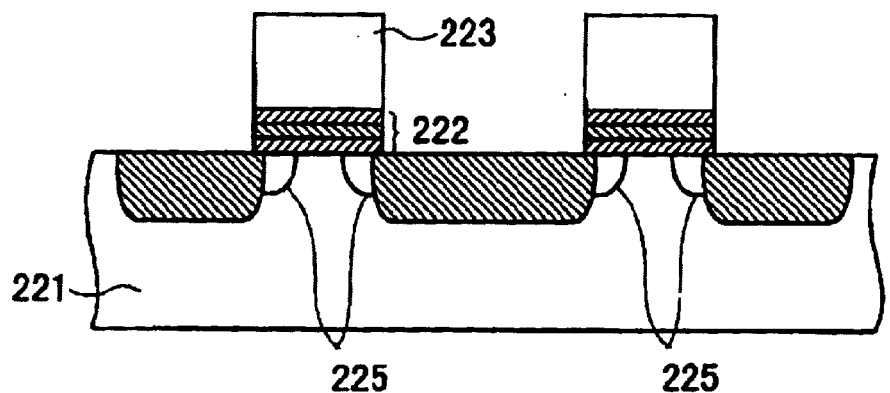
Figure 13C:
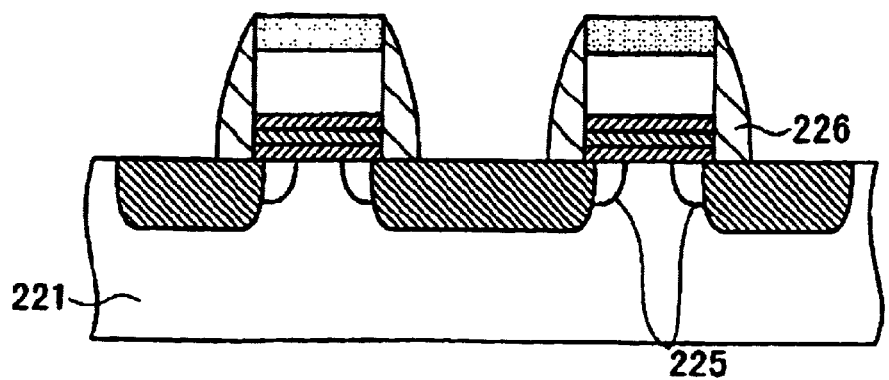

Next, a manufacturing method according to other embodiment of the present invention will be further described. FIGS. 13A and 13C are cross sectional views showing steps for explaining the manufacturing method according to the other embodiment of the present invention. In FIG. 13A, diffusion regions 224 are formed in the contact regions E, D, and F in a substrate 221. Referring to FIG. 13B, P-type pocket implantation regions 225 are provided for the N-type diffusion region 224 at the point D connected to the program/erase only metal bit line 104 via the contact (refer to FIG. 10) and the diffusion regions 224 at the points E and F connected to the read only metal bit lines (refer to FIG. 10). Configurations of other components are the same as those in FIG. 6. Then, in FIG. 13C, the sidewall spacers are formed on the sidewalls of the gates.

Figure 14A:
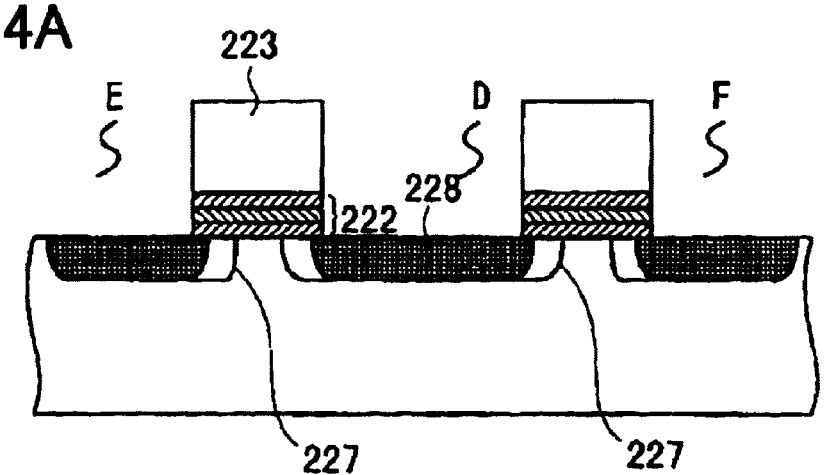
FIGS. 14A to 14C are cross sectional views showing schematically a cross section in FIG. 10 in the sequence in which manufacturing steps using a manufacturing method according to an embodiment of the present invention are performed.
Figure 14B:
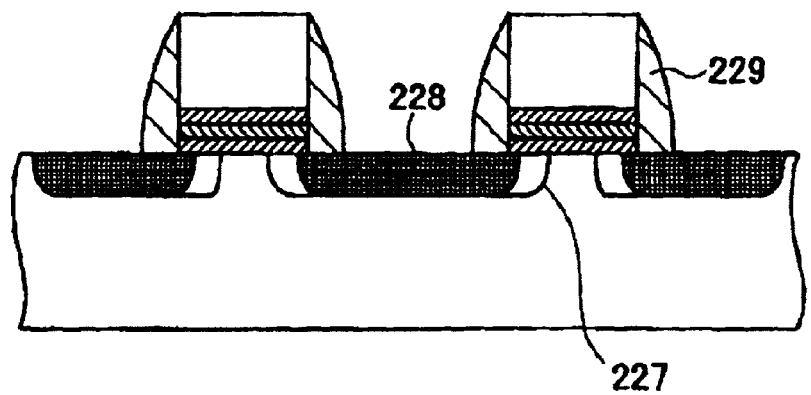
Figure 14C:
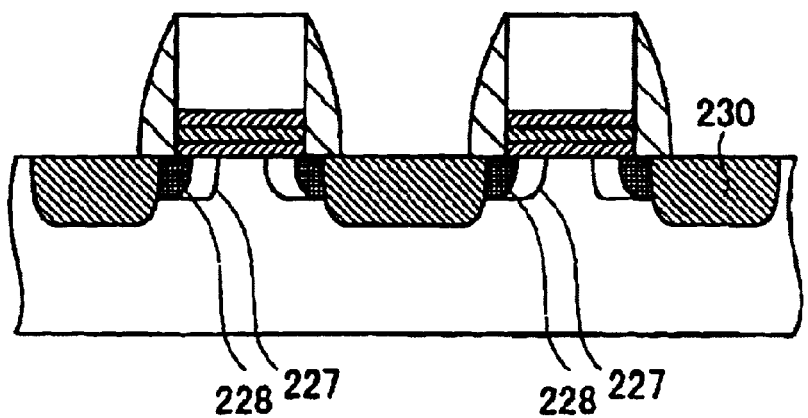

FIGS. 14A to 14C are cross sectional views showing steps for explaining a manufacturing method according to still other embodiment of the present invention.

Referring to FIG. 14A, low-concentration impurity regions 228 are formed in the contact regions E, D, and F in the substrate 221, and P-type pocket implantation regions 227 are respectively formed for the low-concentration impurity regions 228 immediately under gate electrodes 223. The P-type pocket implantation regions 227 are formed in a method shown in FIG. 6B.

Referring to FIG. 14B, sidewall spacers 229 are formed on the sidewalls of the gate.

Next, referring to FIG. 14C, implantation of ions of arsenic or the like is performed to form diffusion regions 230 respectively in the contact regions E, D, and F.

As shown in FIG. 14C, the P-type pocket implantation regions 227 are provided for the N-type diffusion region 230 at the point D connected to the program/erase only metal bit line 104 via the contact (refer to FIG. 10) and the respective diffusion regions 230 at the points E and F connected to the read only metal bit lines (refer to FIG. 10), and the N-type pocket implantation region 228 is provided inside corresponding P-type pocket implantation region 227.

Figure 15A:
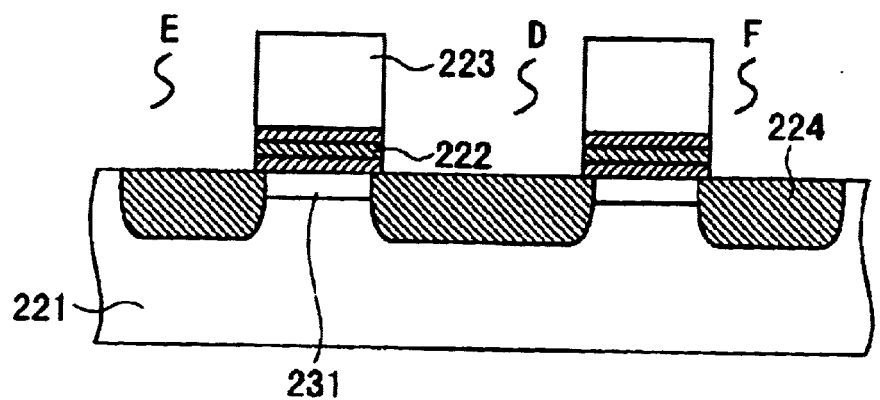
FIGS. 15A to 15B are diagrams showing schematically a cross section in FIG. 10 in the sequence in which manufacturing steps using a manufacturing method according to an embodiment of the present invention are performed.
Figure 15B:
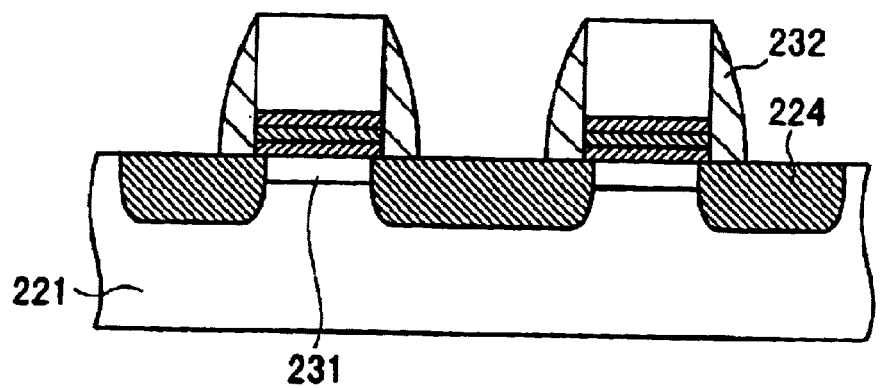

FIGS. 15A and 15B are cross sectional views showing steps for explaining a manufacturing method according to other embodiment of the present invention. Referring to FIG. 15A, P-type pocket implantation regions 231 are provided in channel regions immediately under the gate electrodes 223. At this step, the P-type pocket implantation regions 231 are formed in the method shown in FIG. 6B. Next, referring to FIG. 15B, sidewall spacers 232 are formed on the sidewalls of the gate.

Foregoing descriptions were directed to the above-mentioned embodiments of the present invention. The present invention is not limited to the configurations of the above-mentioned embodiments, and of curse includes various variations and modifications that could be performed by those skilled in art within a scope of claims of the invention.

The meritorious effects of the present invention are summarized as follows.

As described above, according to the present invention, a one-transistor-per-cell configuration in an X cell is realized and the memory cell size can be reduced.

Further, according to the present invention, the one-transistor-per-cell configuration is employed, and single-layer polycrystalline silicon configuration is employed. Thus, manufacturing steps can be simplified.

Further, according to the present invention, a salicidation process is easily adopted. Thus, the parasitic resistance caused by interconnection can be reduced, and a voltage necessary for the program operation can be lowered. For this reason, according to the present invention, a circuit area required for a charge pump and the like can be reduced.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
a semiconductor substrate; and
a plurality of unit cells constituting a cell array,
wherein each adjacent two memory cells in said cell array comprise:
first, second and third diffusion regions formed in said semiconductor substrate and separated from one another;
a first insulating film formed on said semiconductor substrate and covering a region between said first diffusion region and said second diffusion region;
a first gate electrode formed on and overlying said first insulating film;
a second insulating film formed on said substrate and covering a region between said diffusion region and said third diffussion region; and
a second gate electrode formed on and overlying said second insulating film;
wherein a first one of said adjacent two memory cells comprises a first memory cell transistor including said first and second diffusion regions, said first insulating film, and said first gate electrode;
wherein a second one of said adjacent two memory cells comprises a second memory cell transistor including said second and third diffusion regions, said second insulating film, and said second gate electrode; and
wherein said semiconductor memory device further comprises:
first, second, and third bit lines provided, respectively, on first, second, and third layers provided over said semiconductor substrate and connected via associated contacts to said first, second and third diffusion regions respectively;
a word line connected in common to said first and second gate electrodes, or first and second word lines connected respectively to said first and second gate electrodes; and
an impurity region having a polarity opposite that of said second diffusion region and formed at an end portion of said second diffusion region in the semiconductor substrate immediately under at least one gate electrode of said first and second gate electrodes.

2. The semiconductor memory device according to claim 1, wherein each of said first and second insulating films comprises an electric charge trapping film.

3. The semiconductor memory device according to claim 1, wherein said semiconductor memory device is programmable by applying a predetermined positive voltage to the word line connected to the gate electrode of a memory cell to be programmed, applying a positive program voltage to the second bit line connected to said memory cell to be programmed; setting one of the first and third bit lines connected to said memory cell to be programmed to a ground potential, and setting the other one of said first and third bit lines to a positive program inhibiting voltage.

4. The semiconductor memory device according to claim 3, wherein the second bit line is extended from one side to other side of said cell array, so that when programming is performed, the positive program voltage is applied from both ends of the second bit line in a longitudinal direction.

5. The semiconductor memory device according to claim 1, wherein said semiconductor memory device is erasable by;
applying a ground potential or a negative voltage to the word line connected to the gate electrode of a memory cell to be erased,
applying a positive erase voltage to the second bit line connected to said memory cell to be erased, and
injecting hot holes into the insulating film of said memory cell to be erased,
thereby to neutralize electric charges trapped in the insulating film of said memory cell to be erased.

6. The semiconductor memory device according to claim 1, wherein said semiconductor memory device is readable by:
applying predetermined positive voltage to the word line connected to the gate electrode of a memory cell to be read, applying ground potential to the second bit line connected to said memory cell to be read, and applying positive read voltage to one of the first and third bit lines connected to said memory cell to be read.

7. The semiconductor memory device according to claim 1, wherein said semiconductor memory device is readable by applying a predetermined positive voltage to the second bit line connected to a memory cell to be read, and applying a ground potential to one of the first and third bit lines adjacent to the second bit line and connected to the diffusion region for a transistor of said memory cell to be read; and wherein:

the semiconductor memory device further comprises a unit for determining whether said memory cell to be read comprises a programmed cell or an unprogrammed cell according to a magnitude of current flowing between two of the diffusion regions for said memory cell transistor of said memory cell to be read.

8. The semiconductor memory device according to claim 1, wherein said first and second gate electrodes comprise a polycrystalline silicon film, and at least one gate electrode of said first and second gate electrodes comprises a metal silicide layer on a surface thereof.

9. The semiconductor memory device according to claim 8, wherein at least one diffusion region of said first, second, and third diffusion regions comprises a metal silicide layer on a surface thereof.

10. The semiconductor memory device according to claim 1, further comprising an impurity region having the same polarity as any of said diffusion regions and a lower concentration than said diffusion regions and formed in the semiconductor substrate at an end portion of at least one of said first diffusion region immediately under said first gate electrode and said third diffusion region immediately under said second gate electrode.

11. A semiconductor memory device, comprising:

a semiconductor substrate; and a plurality of memory cells comprising a cell array, wherein each adjacent two memory cells in said cell array comprise:

first, second and third diffusion regions formed in said semiconductor substrate and separated from one another;

a first insulating film formed on said semiconductor substrate and covering a region between said first diffusion region and said second diffusion region;

a first rate electrode formed on and overlying said first insulating film;

a second insulating film formed on said substrate and covering a region between said second diffusion region and said third diffusion region; and a second gate electrode formed on and overlying said second insulating film;

wherein a first one of said adjacent two memory cells comprises a first memory cell transistor including said first and second diffusion regions, said first insulating film, and said first gate electrode;

wherein a second one of said adjacent two memory cells comprises a second memory cell transistor including said second and third diffusion regions, said second insulating film, and said second gate electrode; and wherein said semiconductor memory device further comprises:

first, second, and third bit lines provided, respectively, on first, second, and third layers provided over said semiconductor substrate and connected via associated contacts to said first, second and third diffusion regions respectively;

a word line connected in common to said first and second gate electrodes, or first and second word lines connected respectively to said first and second gate electrodes;

a first impurity region having the same polarity as said second diffusion region and a lower concentration than said second diffusion region and formed at an end portion of said second diffusion region in the semiconductor substrate immediately under at least one gate electrode of said first gate electrode and said second gate electrode; and a second impurity region having a polarity opposite that of said second diffusion region and formed at an end portion of said first impurity region in the semiconductor substrate.

12. The semiconductor memory device according to claim 11, further comprising an impurity region having a polarity opposite that of said diffusion regions and formed in the semiconductor substrate at an end portion of at least one of said first diffusion region immediately under said first gate electrode and said third diffusion region immediately under said second gate electrode.

13. The semiconductor memory device according to claim 11, further comprising:

a third impurity region having the same polarity as said diffusion regions and a lower concentration than said diffusion regions, and formed in the semiconductor substrate at an end portion of at least one of said first diffusion region immediately under said first gate electrode and said third diffusion region immediately under said second gate electrode; and a fourth impurity region having a polarity opposite that of said diffusion regions and formed at an end portion of said third impurity region.

14. The semiconductor memory device according to claim 11, further comprising an impurity region having a polarity opposite that of said diffusion regions in at least one of regions in the semiconductor substrate between an end portion of said second diffusion region immediately under said first gate electrode and said first diffusion region and between an end portion of said second diffusion region immediately under said second gate electrode and said third diffusion region.

15. A semiconductor memory device comprising:

first, second, third, and fourth diffusion regions provided in four regions located on vertexes of a rectangle in a semiconductor substrate for a cell array region having a plurality of memory cells, wherein said first and third diffusion regions are located on a first diagnol line of said rectangle;

wherein said second and fourth diffusion regions are located on a second diagonal line of said rectangle; and wherein said semiconductor memory device further comprises:

a first insulating film formed on said semiconductor substrate and covering a region between said first and second diffusion regions;

a first gate electrode formed on and overlying said first insulating film;

a second insulating film formed on said semiconductor substrate and covering a region between said second and third diffusion regions;

a second gate electrode formed on and overlying said second insulating film;

a third insulating film formed on said semiconductor substrate and covering a region between said third and fourth diffusion regions;

a third gate electrode formed on and overlying said third insulating film;

a fourth insulating film formed on said semiconductor substrate and covering a region between said fourth and first diffusion regions;

a fourth gate electrode formed on and overlying said fourth insulating film;

a first word line connected in common to said first gate electrode and said second gate electrode;

a second word line connected in common to said third gate electrode and said fourth gate electrode;

a first bit line, provided on a layer overlying said semiconductor substrate, crossing over said first and second word lines, and connected to said first diffusion region;

a second bit line, provided on a layer overlying said semiconductor substrate, crossing over said first and second word lines, and connected to said second and fourth diffusion regions;

a third bit line, provided on a layer overlying said semiconductor substrate, crossing over said first and second word lines, and connected said third diffusion region;

wherein a first memory cell comprises a first memory cell transistor including said first and second diffusion regions, said first insulating film, and said first gate electrode;

wherein a second memory cell comprises a second memory cell transistor including said second and third diffusion regions, said second insulating film, and said second gate electrode, said second memory cell being adjacent to said first memory cell;

wherein a third memory cell comprises a third memory cell transistor including said third and fourth diffusion regions, said third insulating film, and said third gate electrode, said third memory cell being adjacent to said second memory cell; and wherein a fourth memory cell comprises a fourth memory cell transistor including said fourth and first diffusion regions, said fourth insulating film, and said fourth gate electrode, said fourth memory cell being adjacent to said first and third memory cells.

16. The semiconductor memory device according to claim 15, wherein said cell array region comprises:

a first plurality of sets of unit cells, each set comprising first to fourth unit cells in a direction along which said first and third bit lines and said second bit line are extended; and a second plurality of sets of unit cells, each set comprising first to fourth unit cells in a direction along which said word lines are extended; wherein:

a plurality of pairs of said first and second word lines are provided for sets comprising said first to fourth unit cells disposed in a longitudinal direction of said bit lines;

the fourth diffusion region of a first set and the second diffusion region of another set adjacent to said first set among said sets comprising said first to fourth unit cells disposed in said longitudinal direction of the bit lines are made common;

the first diffusion region of a second set and the third unit cell of another set adjacent to said second set among said sets comprising said first to fourth unit cells disposed in a longitudinal direction of said word lines are made common; and said first bit line and said third bit line are shared between one set and said another set adjacent to said one set in said longitudinal direction of the word lines.

17. The semiconductor memory device according to claim 16, wherein the second bit line extends from one end to the other end of said cell array;

the second bit line is connected to a global program and erase bit line disposed across a bank through first and second bank selection transistors at both ends of said cell array; and said semiconductor memory device is programmable by turning said bank selection transistors at both ends of said cell array, and applying the positive program voltage from both ends of the second bit line.

18. The semiconductor memory device according to claim 15, wherein each of said first and fourth insulating films comprises an electric charge trapping film.

19. The semiconductor memory device according to claim 15, wherein said semiconductor memory device is programmable by:

applying a predetermined positive voltage to one of the first and second word lines connected to a unit cell to be programmed, applying a positive program voltage to the second bit line connected to said memory cell to be programmed;

setting one of the first and third bit lines connected to said memory cell to be programmed is set to a ground potential, and setting the other one of the first and third bit lines connected to said memory cell to be programmed to a positive program inhibiting voltage.

20. The semiconductor memory device according to claim 15, wherein said semiconductor memory device is erasable by:

applying a ground potential or a negative voltage to the word line connected to a memory cell to be erased; and applying a positive erase voltage to the second bit line connected to a memory cell to be erased, to cause holes to be injected into the insulating film of said memory cell to be erased, and to cause electric charge trapped in said insulating film of said memory cell to be neutralized.

21. A method of controlling a semiconductor memory device comprising a cell array having a plurality of memory cells, wherein each two mutually adjacent memory cells in said cell array comprise:

a semiconductor substrate;

first, second, and third diffusion regions formed in said semiconductor substrate and separated from one another;

a first insulating film formed on said semiconductor substrate to cover a region between said first diffusion region and said second diffusion region, a first gate electrode formed on and overlying said first insulating film;

a second insulating film formed on said semiconductor substrate to cover a region between said second diffusion region and said third diffusion region, and a second gate electrode formed on and overlying said second insulating film, wherein:

a first memory cell comprises a first memory cell transistor including said first and second diffusion regions, said first insulating film, and said first gate electrode, a second memory cell comprises a second another memory cell transistor including said second and third diffusion regions, said second insulating film, and said second gate electrode, said first and second gate electrodes are connected to first and second word lines, respectively, or connected in common to comprise a word line, said first diffusion region is connected to a first bit line disposed on a layer overlying said semiconductor substrate, said second diffusion region is connected to a second bit line disposed on said layer overlying said semiconductor substrate, and said third diffusion region is connected to a third bit line disposed on said layer overlying said semiconductor substrate, said method comprising:

applying a first positive voltage to the word line connected to the gate electrode of a memory cell to be programmed;

applying a second positive voltage, lower than the first positive voltage, to the second bit line connected to said memory cell to be programmed for a predetermined period of time;

setting one of the first and third bit lines connected to said memory cell to be programmed to a ground potential; and setting the other one of the first and third bit lines connected to said memory cell to be programmed to a third positive program inhibiting voltage, thereby to cause channel hot electrons to be injected into the insulating film of said memory cell to be programmed.

22. The method according to claim 21, further comprising:

applying the second positive program voltage from both ends of the second bit line in a longitudinal direction when programming is performed, the second bit line extending from one end to other end of said cell array.

23. The method according to claim 21, further comprising:

applying the ground potential or a negative voltage to the word line connected to the gate electrode of a memory cell to be erased; and applying the first positive voltage to the second bit line connected to said memory cell to be erased, thereby to cause hot holes to be injected into the insulating film of said memory cell to be erased to neutralize electric charge trapped in said insulating film of said memory cell to be erased.

24. The method according to claim 21, further comprising:

applying a fourth positive voltage to the word line connected to the gate electrode of a memory cell to be read, applying the ground potential to the second bit line connected to said memory cell to be read; and applying a read voltage to one of the first and third bit lines connected to said memory cell to be read.

25. The method according to claim 21, further comprising:

applying a fourth positive voltage to the second bit line connected to a memory cell to be read;

applying the ground potential to one of the first and third bit lines connected to said memory cell to be read; and determining whether said memory cell to be read comprises a written cell or an unwritten cell according to a magnitude of current flowing between two of the diffusion regions for said memory cell to be read.

26. A semiconductor memory device comprising:

a semiconductor substrate; and a plurality of memory cells comprising a cell array, wherein each adjacent two memory cells in said cell array comprise:

first, second, and third diffusion regions formed in said semiconductor substrate and separated from one another;

a first storage node formed on said semiconductor substrate and covering a region between said first diffusion region and said second diffusion region;

a first gate electrode formed on and overlying said first storage node;

a second storage node formed on said substrate and covering a region between said second diffusion region and said third diffusion region; and a second gate electrode formed on and overlying said second storage node;

wherein said semiconductor memory device further comprises:

first, second, and third bit lines provided, respectively, on first, second, and third layers provided over said semiconductor substrate, said first, second, and third bit lines being connected via associated contacts to said first, second and third diffusion regions, respectively; and a word line connected in common to said first and second gate electrodes, or first and second word lines connected respectively to said first and second gate electrodes;

wherein a first memory cell comprises a first memory cell transistor including said first and second diffusion regions, said first storage node, and said first gate electrode;

wherein a second memory cell comprises a second memory cell transistor including said second and third diffusion regions, said second storage node, and said second gate electrode; and wherein each memory cell is programmable by a first positive voltage applied to the gate electrode of the memory cell to be programmed, a second positive voltage, lower than the first positive voltage, applied for a predetermined period of time to the second bit line connected to the memory cell to be programmed, a voltage lower than the second positive voltage applied to one of the first and third bit lines connected to the memory cell to be programmed, and a third positive, program-inhibiting, voltage applied to the other one of the first and the third bit lines connected to the memory cell to be programmed, causing channel hot electrodes to be injected into the storage node of the memory cell to be programmed.

* * * * *